United States Patent
Schrems

(10) Patent No.: US 6,310,375 B1
(45) Date of Patent: Oct. 30, 2001

(54) TRENCH CAPACITOR WITH ISOLATION COLLAR AND CORRESPONDING MANUFACTURING METHOD

(75) Inventor: Martin Schrems, Langebrueck (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/097,783

(22) Filed: Jun. 15, 1998

Related U.S. Application Data

(63) Continuation-in-part of application No. 09/055,506, filed on Apr. 6, 1998.

(51) Int. Cl.⁷ .................................................. H01L 27/108
(52) U.S. Cl. ........................ 257/301; 257/300; 257/301; 257/302; 257/305
(58) Field of Search ............................ 257/301, 300, 257/302, 305

(56) References Cited

U.S. PATENT DOCUMENTS

| | | | |
|---|---|---|---|
| 5,225,698 | * 7/1993 | Kim et al. ............................. | 257/303 |
| 5,360,758 | 11/1994 | Bronner et al. ........................ | 437/52 |
| 5,468,979 | * 11/1995 | Tani et al. ............................. | 257/304 |
| 5,555,520 | * 9/1996 | Sudo et al. ............................ | 365/149 |
| 5,656,535 | 8/1997 | Ho et al. ............................... | 438/386 |
| 5,658,816 | 8/1997 | Rajeevakumar ..................... | 438/386 |
| 5,723,889 | * 3/1998 | Choi et al. ............................. | 257/329 |
| 5,770,876 | * 6/1998 | Lam et al. ............................. | 257/301 |
| 5,793,075 | * 8/1998 | Alsmeier et al. ..................... | 257/296 |
| 5,811,848 | * 9/1998 | Chao ..................................... | 257/296 |
| 5,825,073 | * 10/1998 | Radosevich et al. ................. | 257/534 |
| 5,838,045 | * 11/1998 | Muller et al. ......................... | 257/301 |
| 5,844,266 | * 12/1998 | Stengl et al. ......................... | 257/301 |
| 5,861,649 | * 1/1999 | Yoshida et al. ...................... | 257/301 |

FOREIGN PATENT DOCUMENTS

| | | | |
|---|---|---|---|
| 000464580 | * 1/1992 | (EP) ..................................... | 257/301 |
| 0 513 532 | 4/1992 | (EP) . | |
| 000579566 | * 1/1994 | (EP) ..................................... | 257/301 |
| 0 713 253 | 5/1996 | (EP) . | |
| 0 791 959 | 8/1997 | (EP) . | |
| 002238428 | * 5/1991 | (GB) ..................................... | 257/301 |
| 401149453 | * 6/1989 | (JP) ...................................... | 257/301 |
| 404212451 | * 8/1992 | (JP) ...................................... | 257/301 |

* cited by examiner

*Primary Examiner*—Eddie Lee
*Assistant Examiner*—Edgardo Ortiz
(74) *Attorney, Agent, or Firm*—Stanton C. Braden

(57) ABSTRACT

The present invention provides a trench capacitor, particularly for use in a semiconductor memory cell (100), having an isolation collar (168) with a trench (108) formed in a substrate (101); said isolation collar (168) formed in the upper region of said trench (108); an optional buried plate (165) in said substrate region surrounding said lower region of said trench (180) as a first capacitor plate; a dielectric layer (164) for lining said lower region of said trench (108) and said isolation collar (168) as capacitor dielectric; and a conductive second fill material (161) filled in said trench (108) as a second capacitor plate; wherein said diameter of said lower region of said trench (108) is at least equal to said diameter of said upper region of said trench (108). Moreover, the invention provides a corresponding manufacturing method.

6 Claims, 35 Drawing Sheets

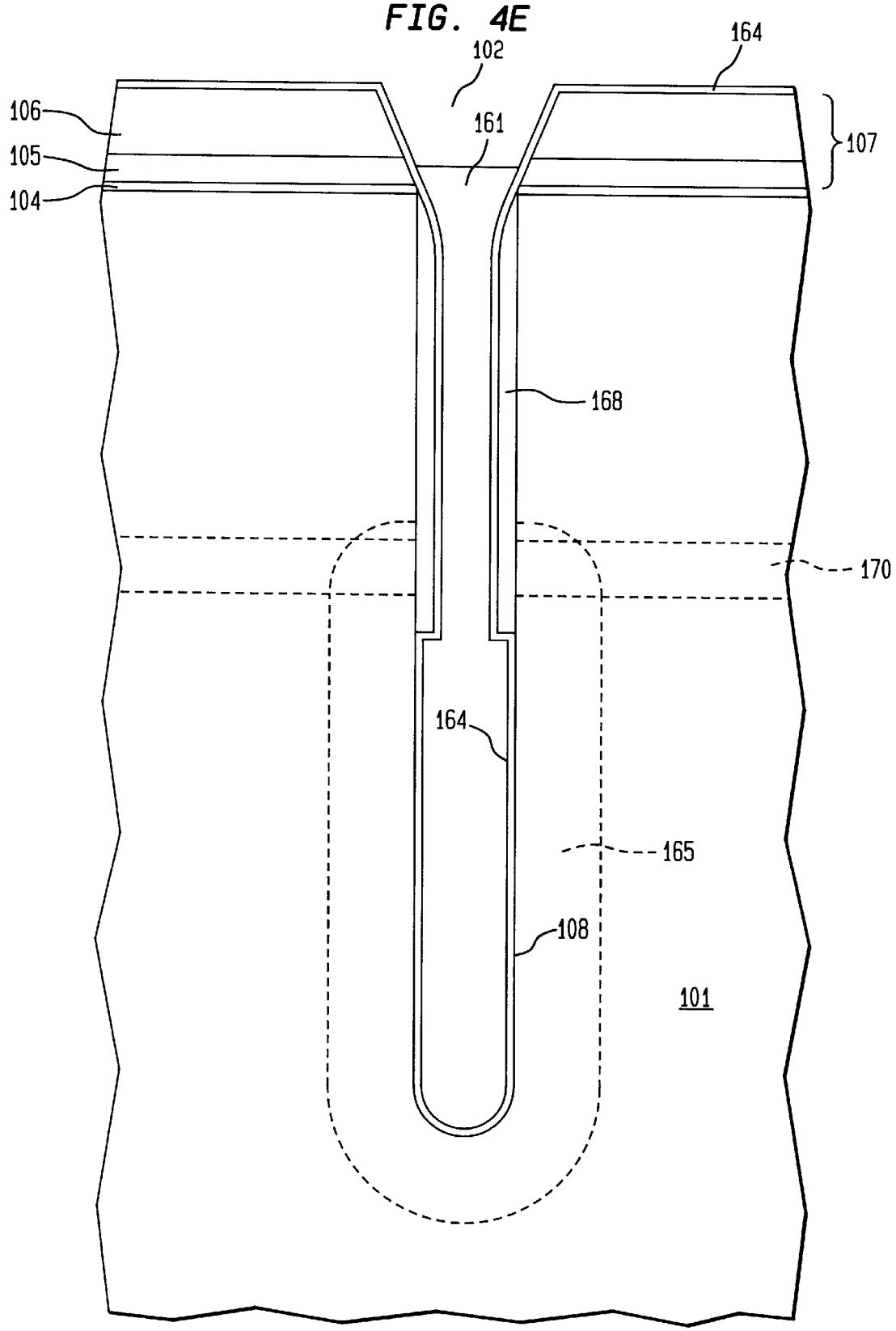

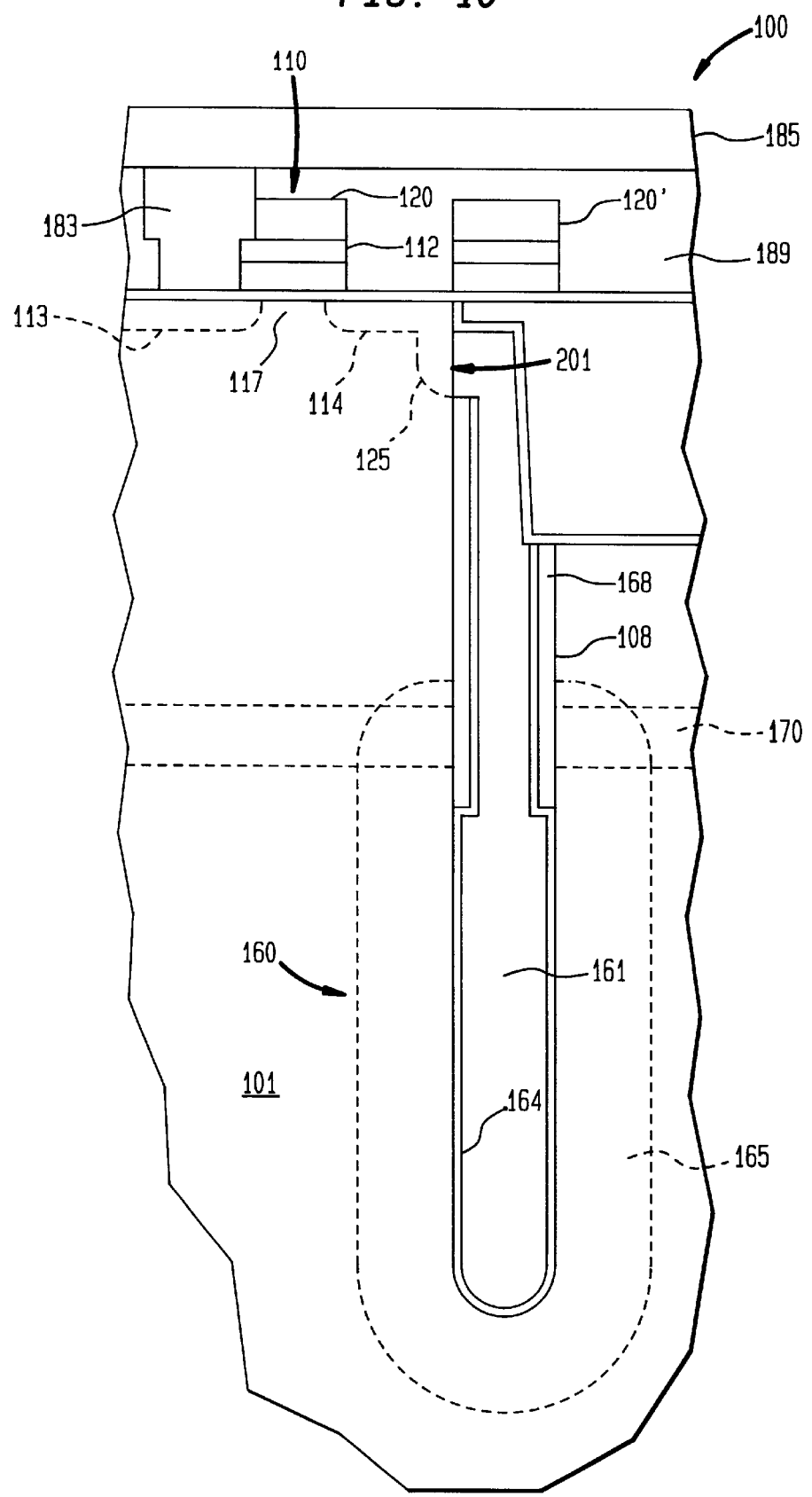

TRENCH CAPACITOR WITH ISOLATION COLLAR AND CORRESPONDING MANUFACTURING METHOD

Figure 1:
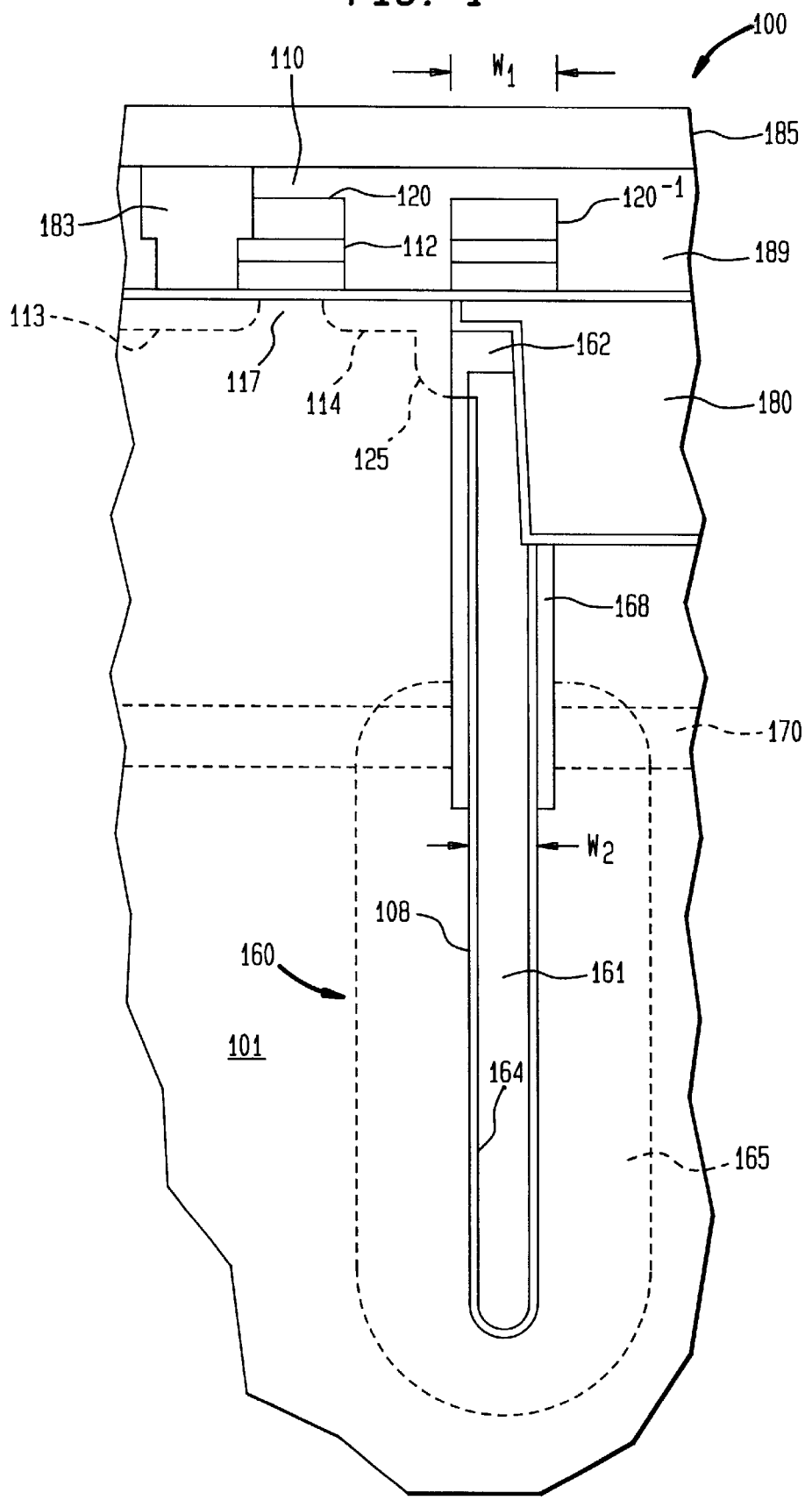

This application is a C-I-P of Ser. No. 09/055,506 filed Apr. 6, 1998.

DESCRIPTION

This invention relates to a trench capacitor having an isolation collar and a corresponding manufacturing method.

Integrated circuits (ICs) or chips employ capacitors for charge storage purposes. An example of an IC that employs capacitors for storing charges is a memory IC, such as a dynamic random access memory (DRAM) chip. The level of the charge ("0" or "1") in the capacitor represents a bit of data.

A DRAM chip includes an array of memory cells interconnected by rows and columns. Typically, the row and column connections are referred to as wordlines and bitlines, respectively. Reading data from or writing data to the memory cells is accomplished by activating the appropriate wordlines and bitlines, Typically, a DRAM memory cell comprises a transistor connected to a capacitor. The transistor includes two diffusion regions separated by a channel, above which is located a gate. Depending on the direction of a current flow between the diffusion regions, one is referred to as the drain and the other as the source. The terms "drain" and "source" are herein used interchangeably to refer to the diffusion regions. The gate is connected to a wordline and one of the diffusion regions is connected to a bitline. The other diffusion region is connected to the capacitor. Applying an appropriate voltage to the gate switches the transistor on, enabling current to flow through channel between the diffusion regions to form a connection between the capacitor and bitline. Switching off the transistor severs this connection by preventing current flowing through the channel.

The charge stored in the capacitor dissipates over time due to current leakage therefrom. Before the charge dissipates to an indeterminate level (below a threshold), the node has to be refreshed.

Continued demand to shrink devices has facilitated the design of DRAMs having greater density and smaller feature size and cell area. To produce cells that occupy less surface area, smaller components such as capacitors are used However, the use of smaller capacitors results in decreased storage capacity, which can adversely affect the performance and operability of the memory device. For example, sense amplifiers require an adequate signal level to reliably sense the information in the cells. The ratio of storage capacitance to bitline capacitance is crucial in determining the signal level. If the capacitor becomes too small, this ratio may be too small to provide an adequate signal. Also, smaller storage capacity requires higher refresh frequency One type of capacitor that is commonly employed in DRAMs is a trench capacitor. A trench capacitor has a three-dimensional structure formed in the silicon substrate. Increasing the volume or capacitance of the trench capacitor can be achieved by etching deeper into the substrate. As such, increasing the capacitance of the trench capacitor does not increase the surface area of the cell.

A conventional trench capacitor comprises a trench etched into the substrate. This trench is typically filled with $n^+$-doped polysilicon which serves as an electrode of the capacitor (referred to as the storage node). Optionally, a second electrode of the capacitor, referred to as a "buried plate", is formed by outdiffusing $n^+$-dopants from a dopant source into a region of the substrate surrounding the lower portion of the trench. An $n^+$-doped silicate glass such as arsenic doped silicate glass (ASG) serves as the dopant source. A node dielectric comprising nitride is provided to separate the two electrodes of the capacitor.

In the upper portion of the trench, a dielectric collar is provided to prevent leakage from the node junction to the buried plate. The node dielectric in the upper portion of the trench where the collar is to be formed is removed prior to its formations Removal of the nitride prevents vertical leakage along the collar.

However, the removal of the upper portion of the nitride layer creates pinholes of the transition between the bottom part of the collar and the upper edge of the node dielectric. Such pinholes degrade the quality of the node dielectric and are a substantial source of charge leakage from the trench. This reduces the retention time of the trench capacitor, adversely impacting its performance, To prevent the formation of pinholes, a two-step trench etch process has been proposed. First, the trench is partially etched by a reactive ion etch (RIE) to the depth of the collar. The RIE is selective to the hard etch mask. Typical chemistry employed for the RIE includes, for example, $NF_3/HBr/He/O_2$. An oxide layer is then deposited and etched to form the collar on the trench sidewalls. The etch, which is a RIE, is selective to silicon using, for example, $CHF_3/He/O_2$, $CHF_3/Ar$, $C_4F_8/Ar$ or $CF_4$ chemistry. The remaining portion of the trench is etched after collar formation. The node dielectric is then formed over the collar and the lower portion of the trench sidewalls. Such a process eliminates the need to remove the upper portion of the node dielectric, thus preventing pinholes from forming.

Although such two-step trench formation is effective in preventing pinholes, the second RIE step for removing silicon may cause excessive erosion of the collar. Degradation of the collar causes leakage to occur. Furthermore, the collar acts as a hard etch mask for the second RIE trench etch, producing a lower portion of the trench having a diameter which is equal to that of the inner circumference of the collar. Thus, the lower portion of the trench is smaller than the upper portion, which has a diameter equal to about the outer circumference of the collar. This is undesirable as it reduces the capacitance of the capacitor.

Thus, it is an object of the present invention to provide an improved trench capacitor having an isolation collar with reduced charge leakage and an increased capacitance. Another object of the invention is the provision of a corresponding manufacturing method.

According to the present invention, this object is achieved by a trench capacitor having an isolation collar as defined in claim 1.

Preferred embodiments are listed in the respective dependent claims.

The method according to the invention has the particular advantage compared to the known solutions that it provides a simplified process for the simultaneous manufacture of collar and buried plate, thus leading to a considerable reduction in costs during the manufacture. The buried plate is self-adjusted with respect to the lower edge of the collar. Moreover, the reliability of the node dielectric is improved, because the node dielectric is formed after the formation of the collar and the buried plate and continuously extends from the trench bottom up to the upper edge of the collar, thus preventing the formation of pinholes at the lower edge of the collar.

The invention provides an amended trench capacitor which may be employed in a memory cell, in particular in a DRAM memory cell. The trench capacitor is formed by forming the complete trench in the substrate in a single step. The trench is filled with a semiconductor material, for example polycristalline silicon or amorphous silicon. The polycristalline silicon in the upper portion of the trench is removed, and a dielectric collar is formed therein. The polysilicon is then removed from the bottom portion of the trench. Subsequently, a node dielectric that lines the collar and the trench sidewalls at the bottom portion of the trench is formed. The trench is filled with a doped material that serves as an electrode of the trench capacitor.

Preferred embodiments of the present invention are illustrated in the drawings and explained in detail in the following description.

Figure 2A:
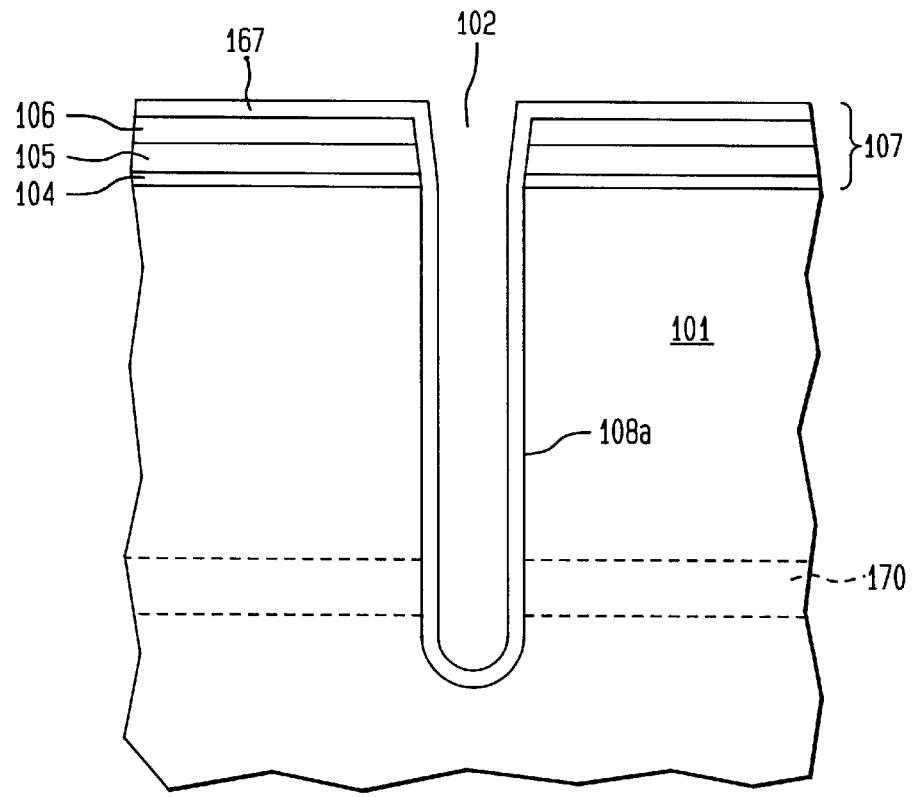
Figure 2B:
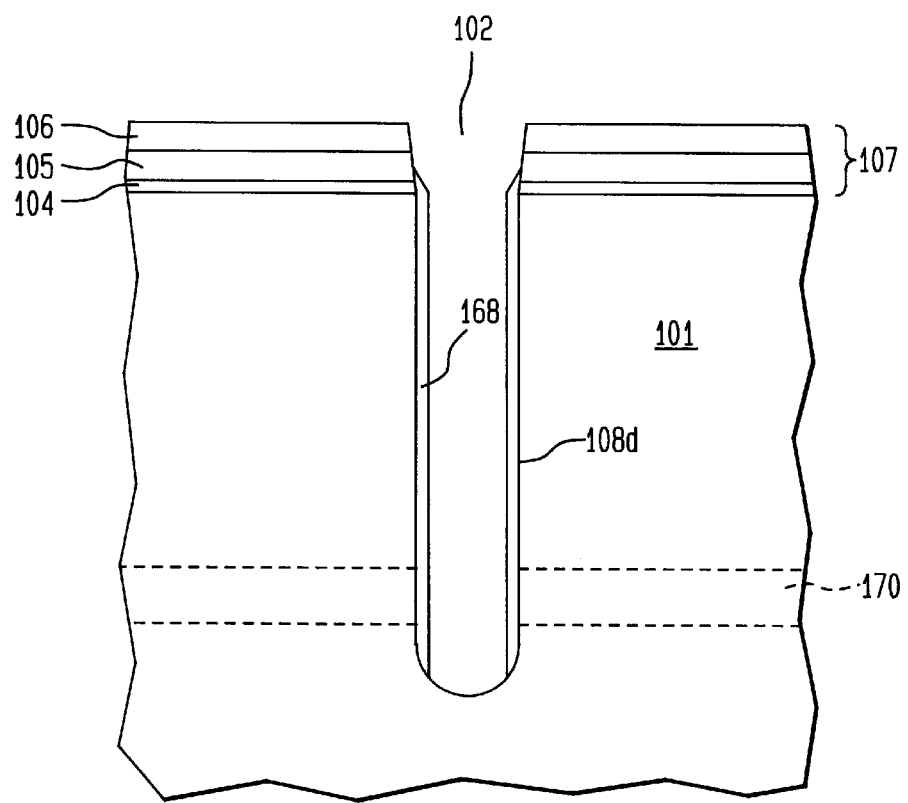
Figure 2C:
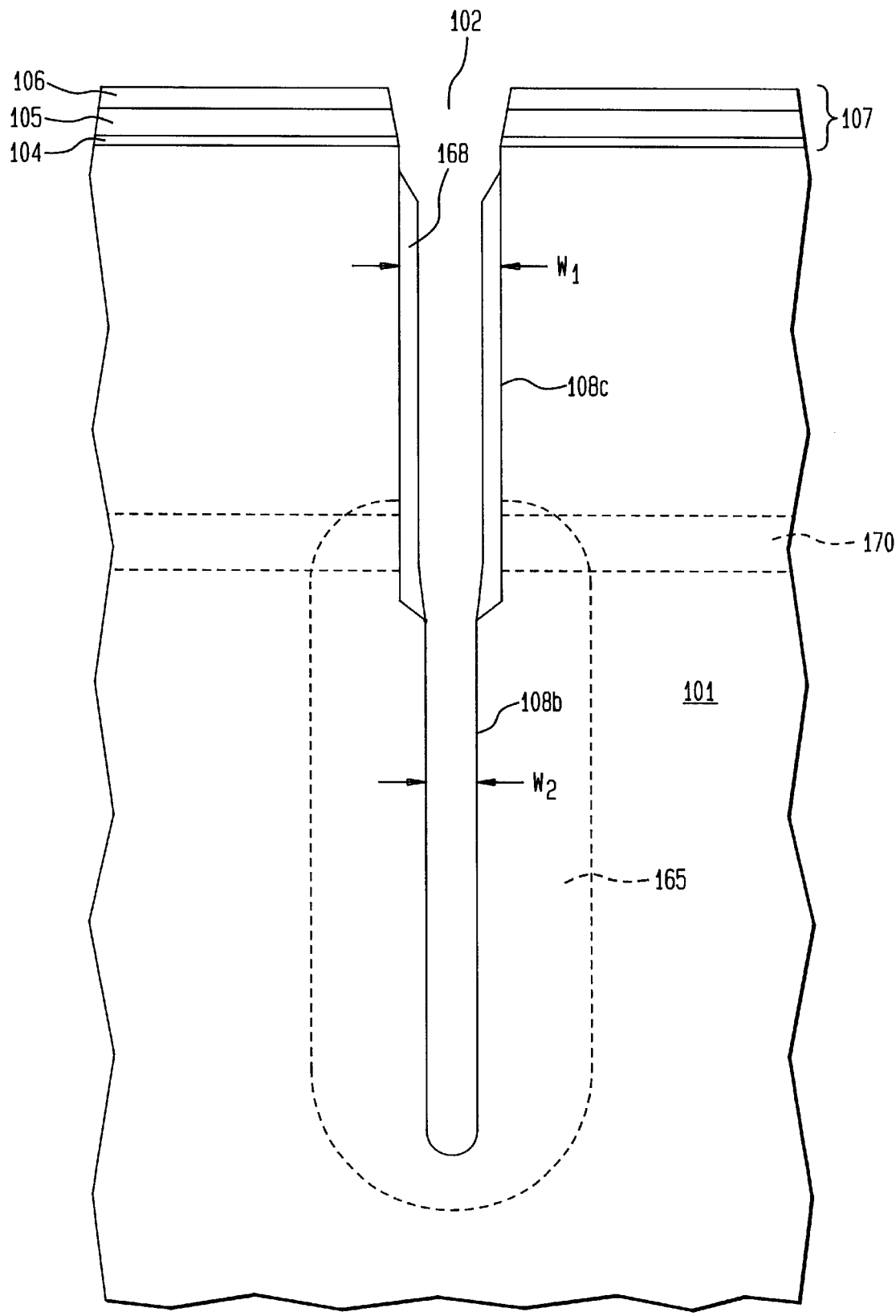
Figure 3:
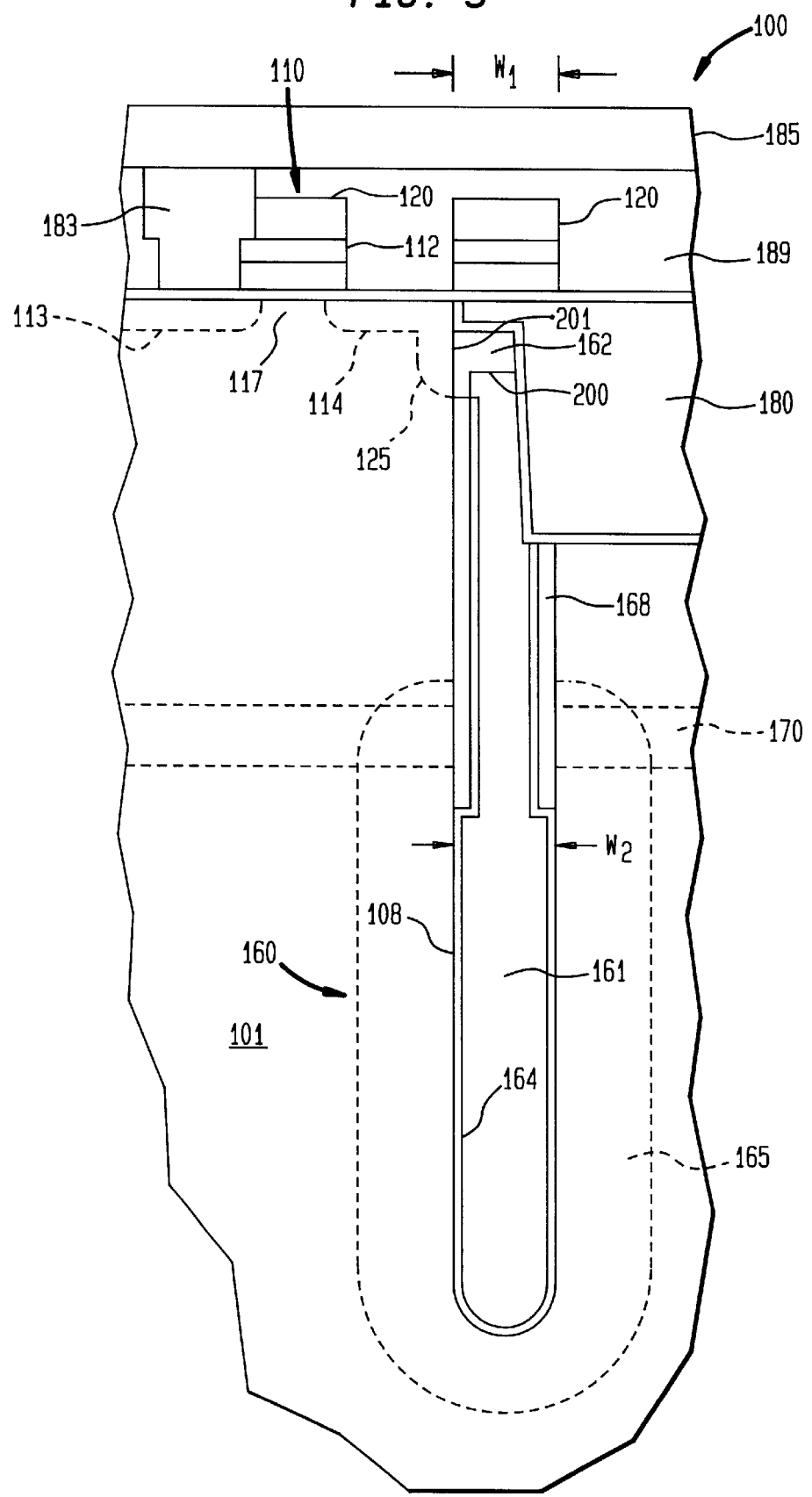
Figure 5:
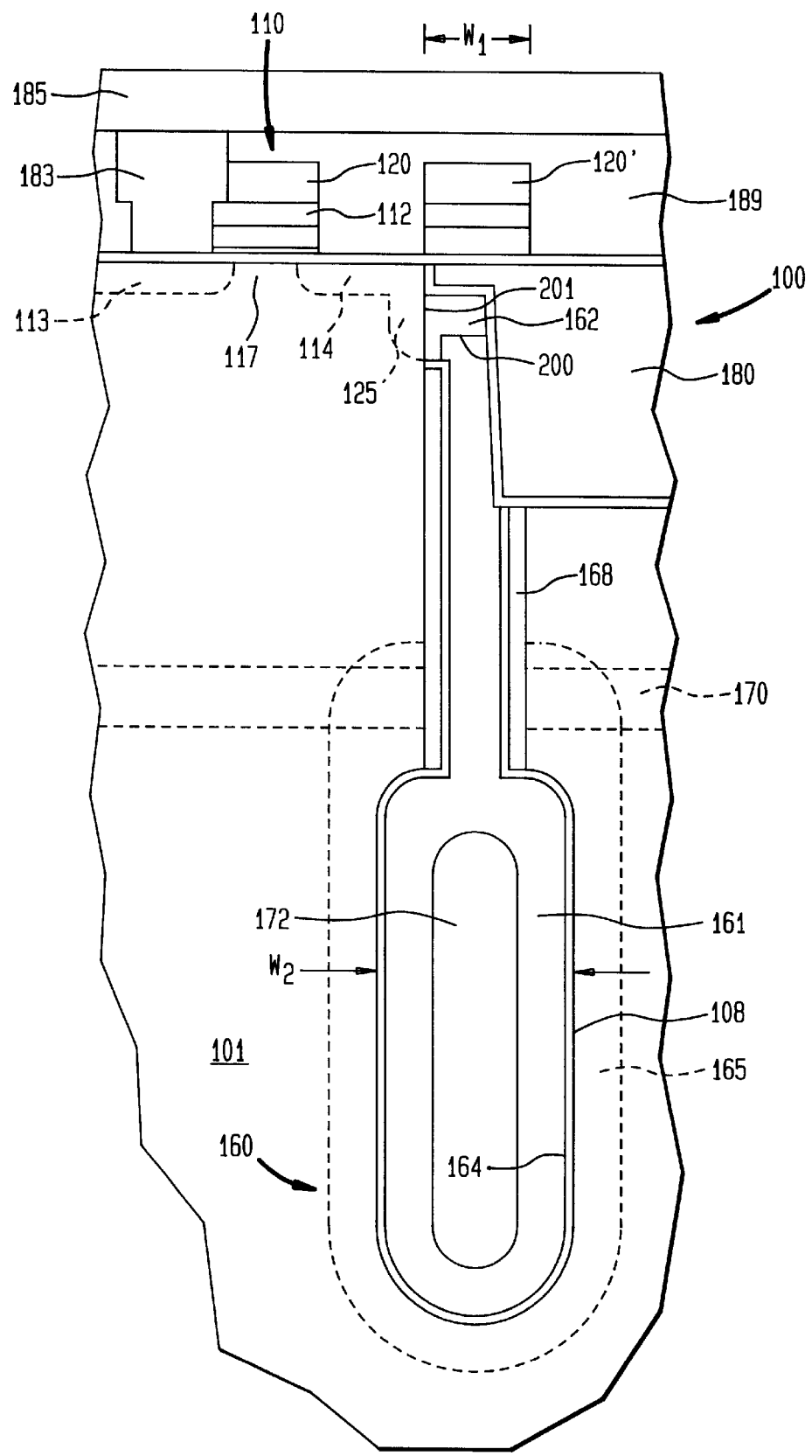
Figure 6A:
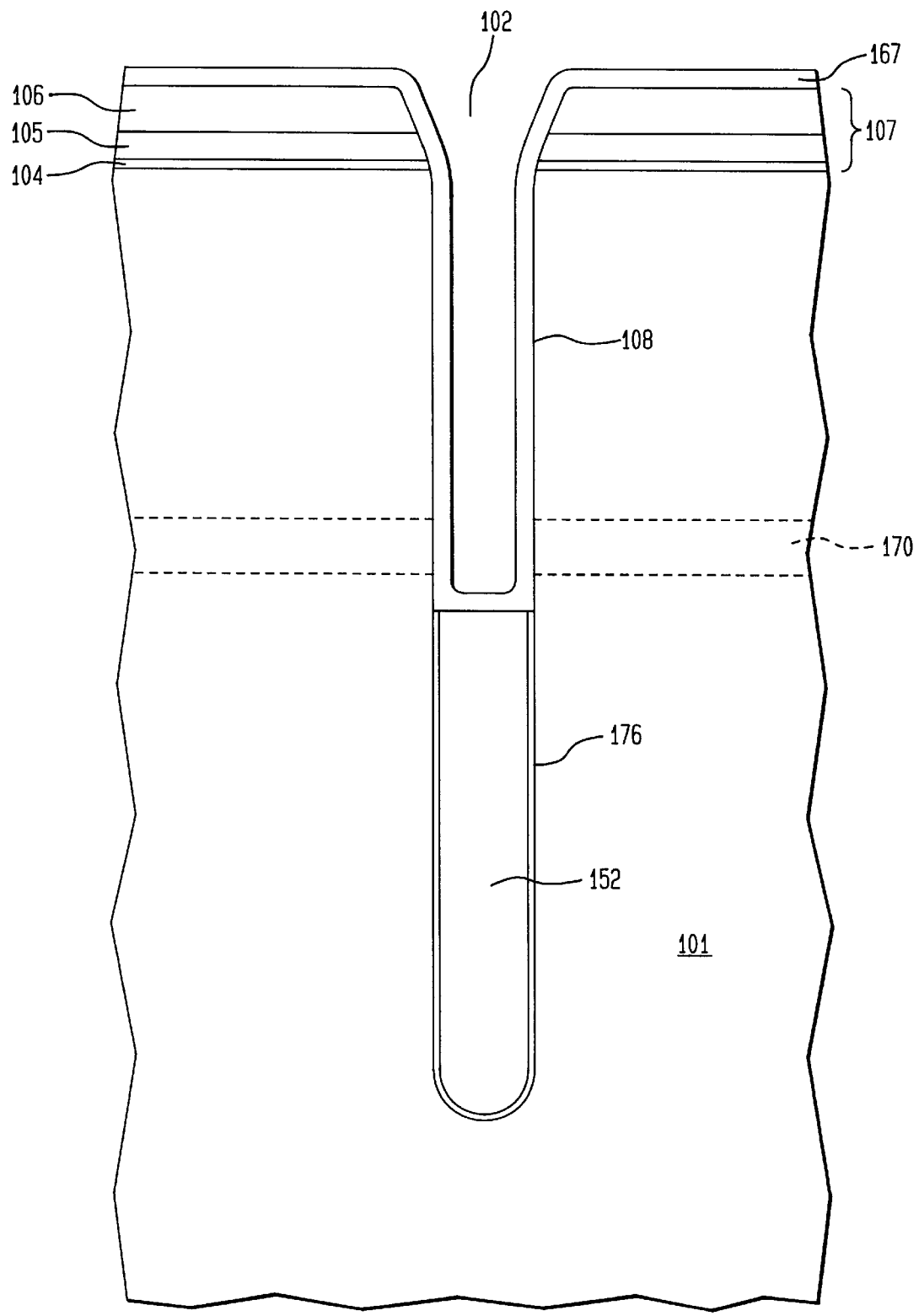
Figure 6B:
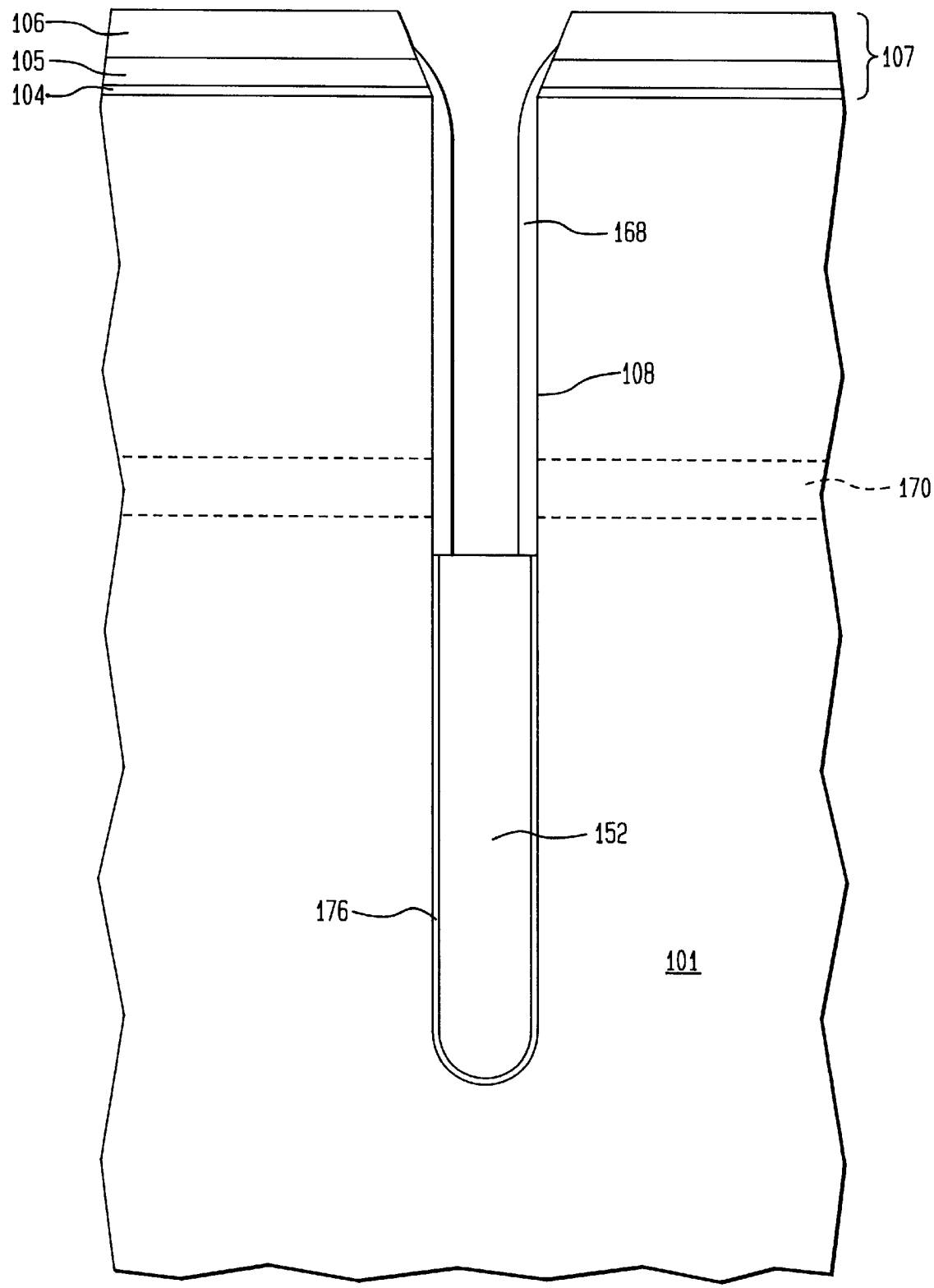
Figure 6C:
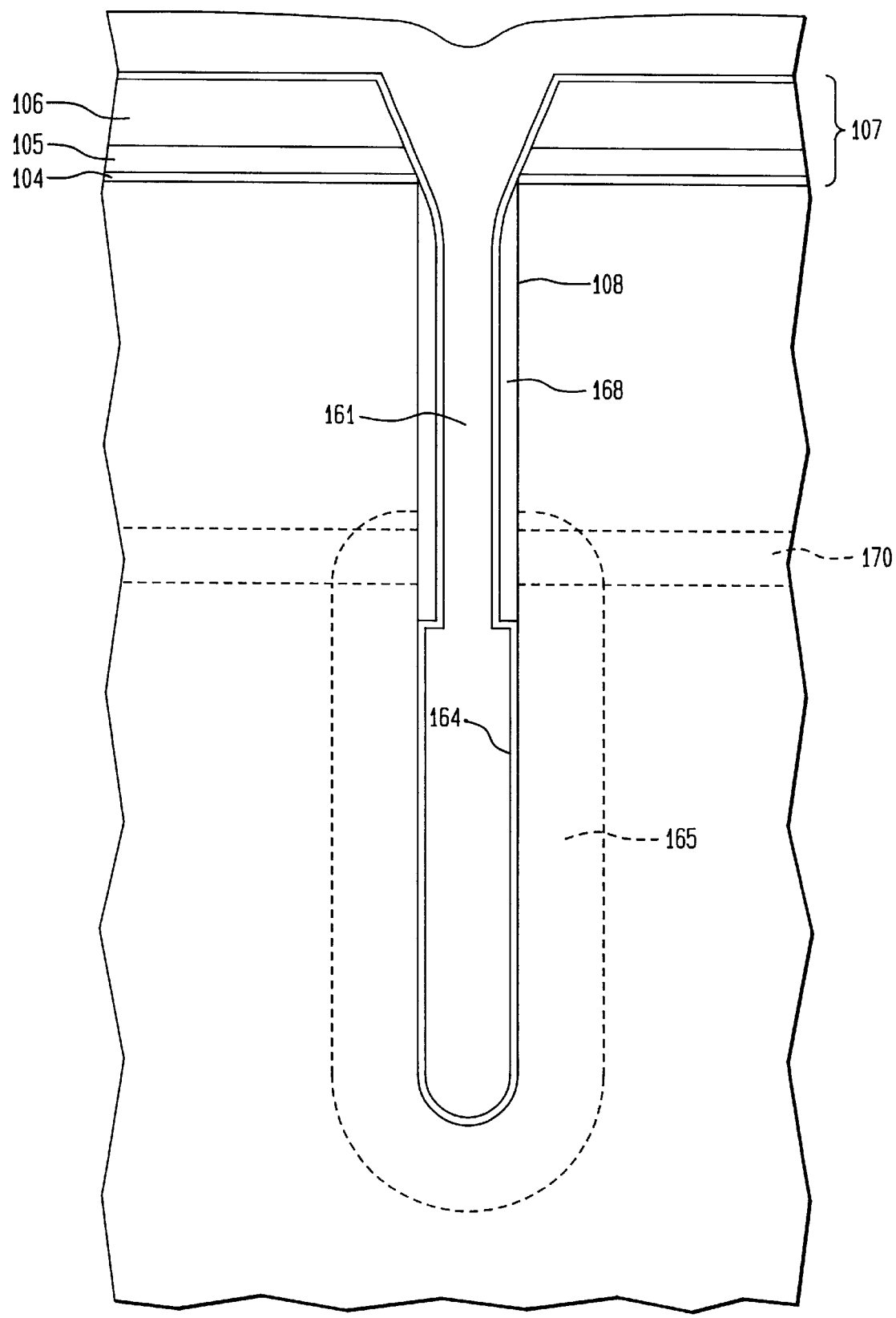
Figure 7A:
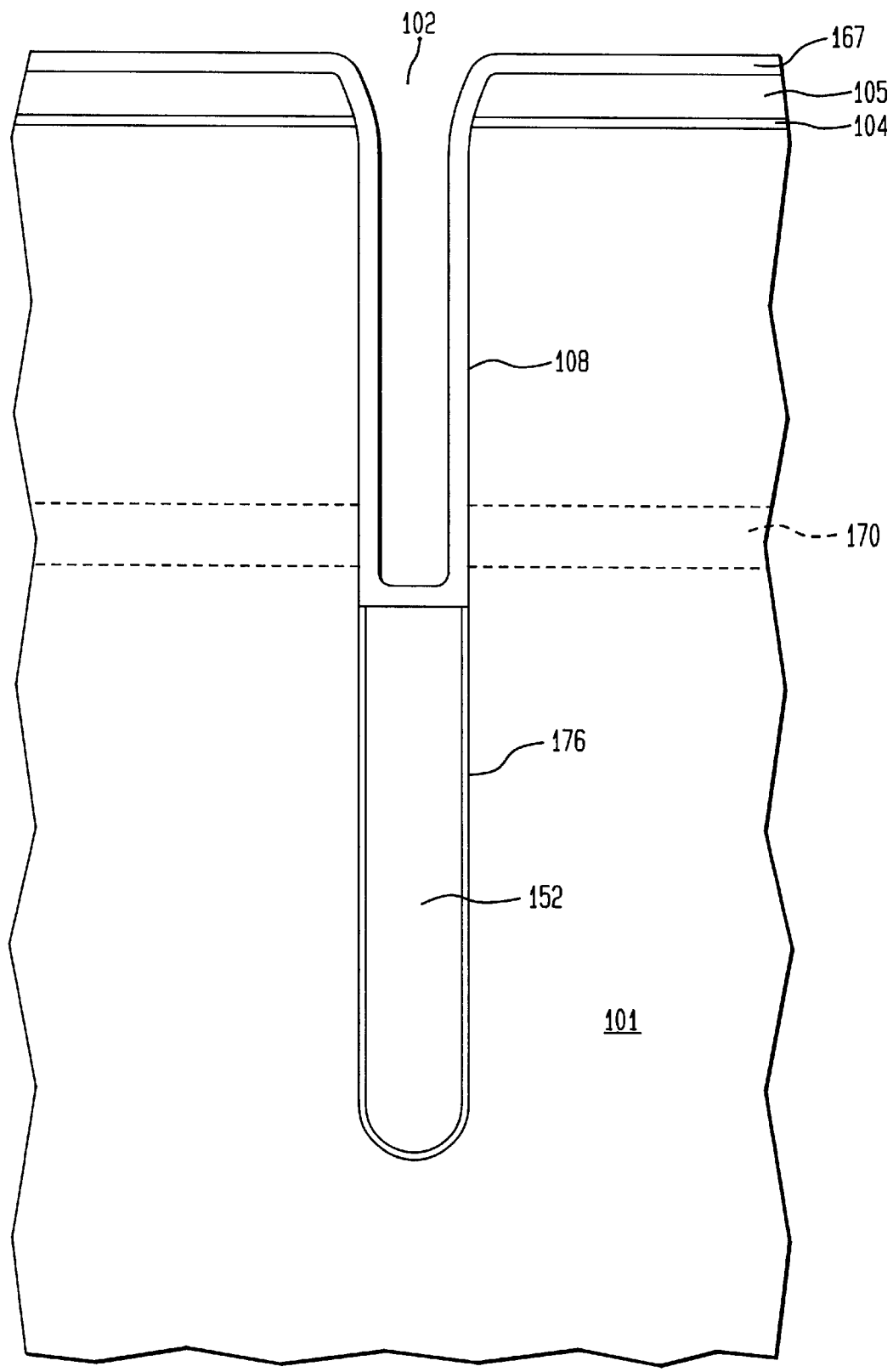
Figure 7B:
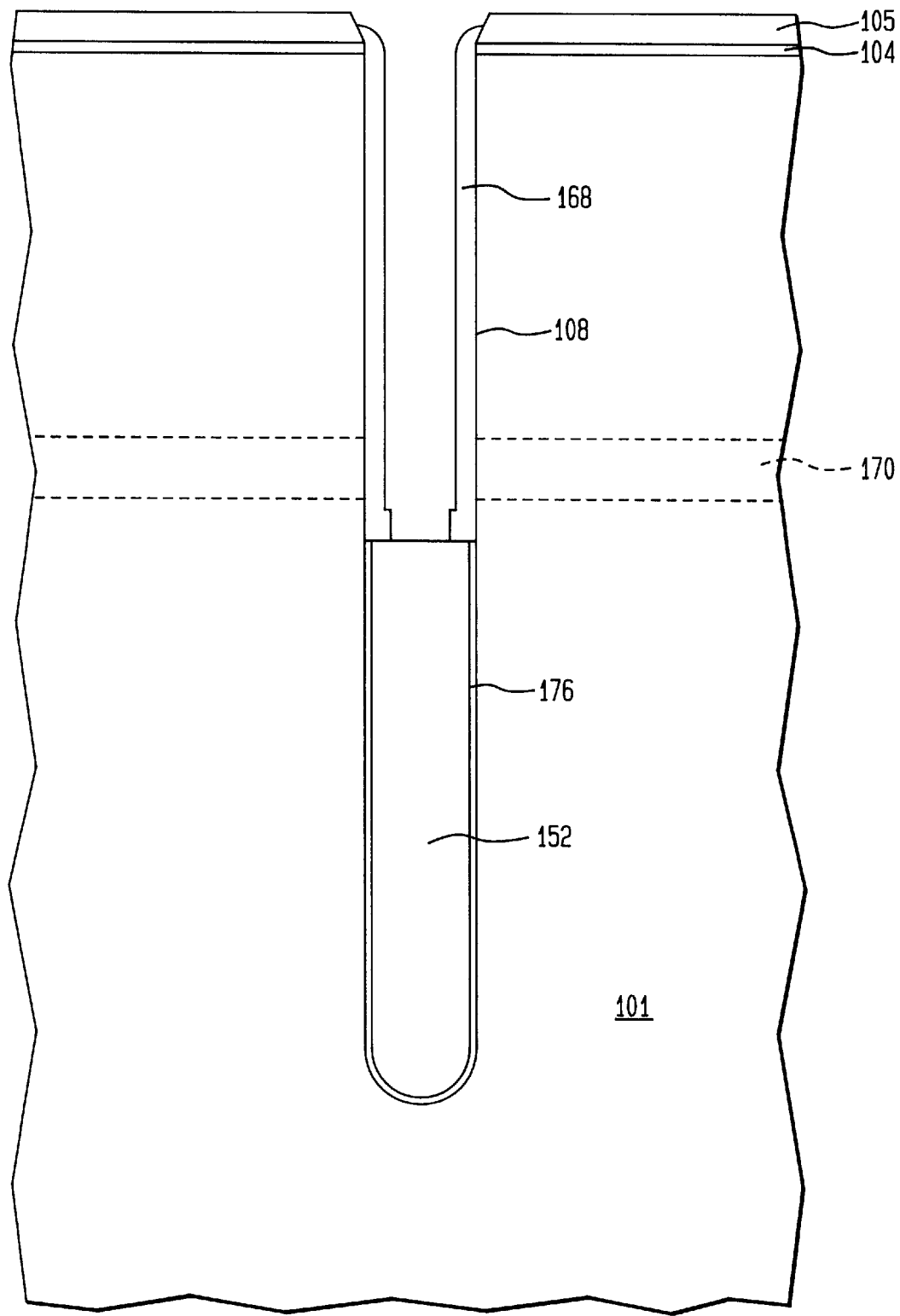
Figure 7C:
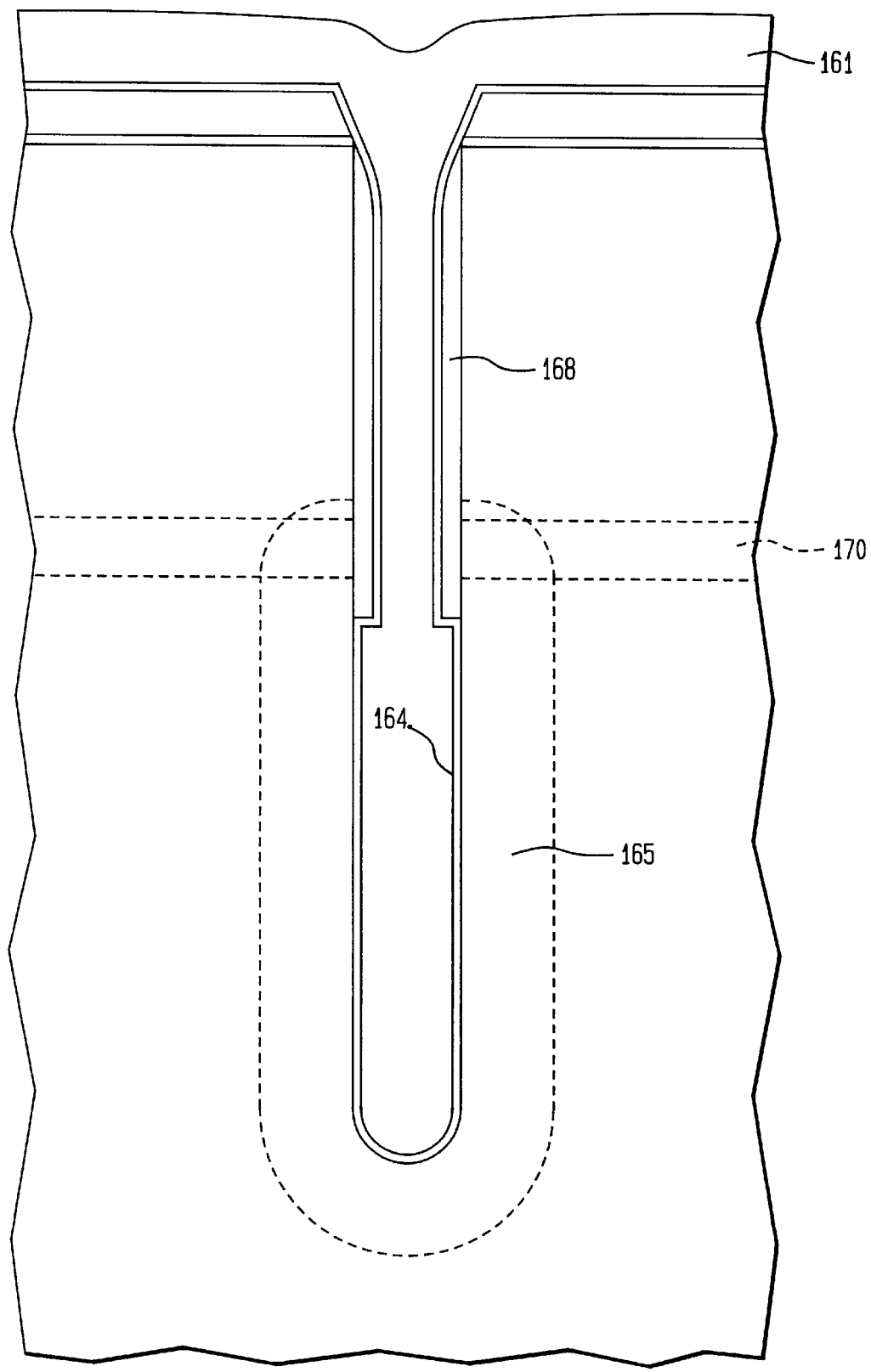
Figure 11A:
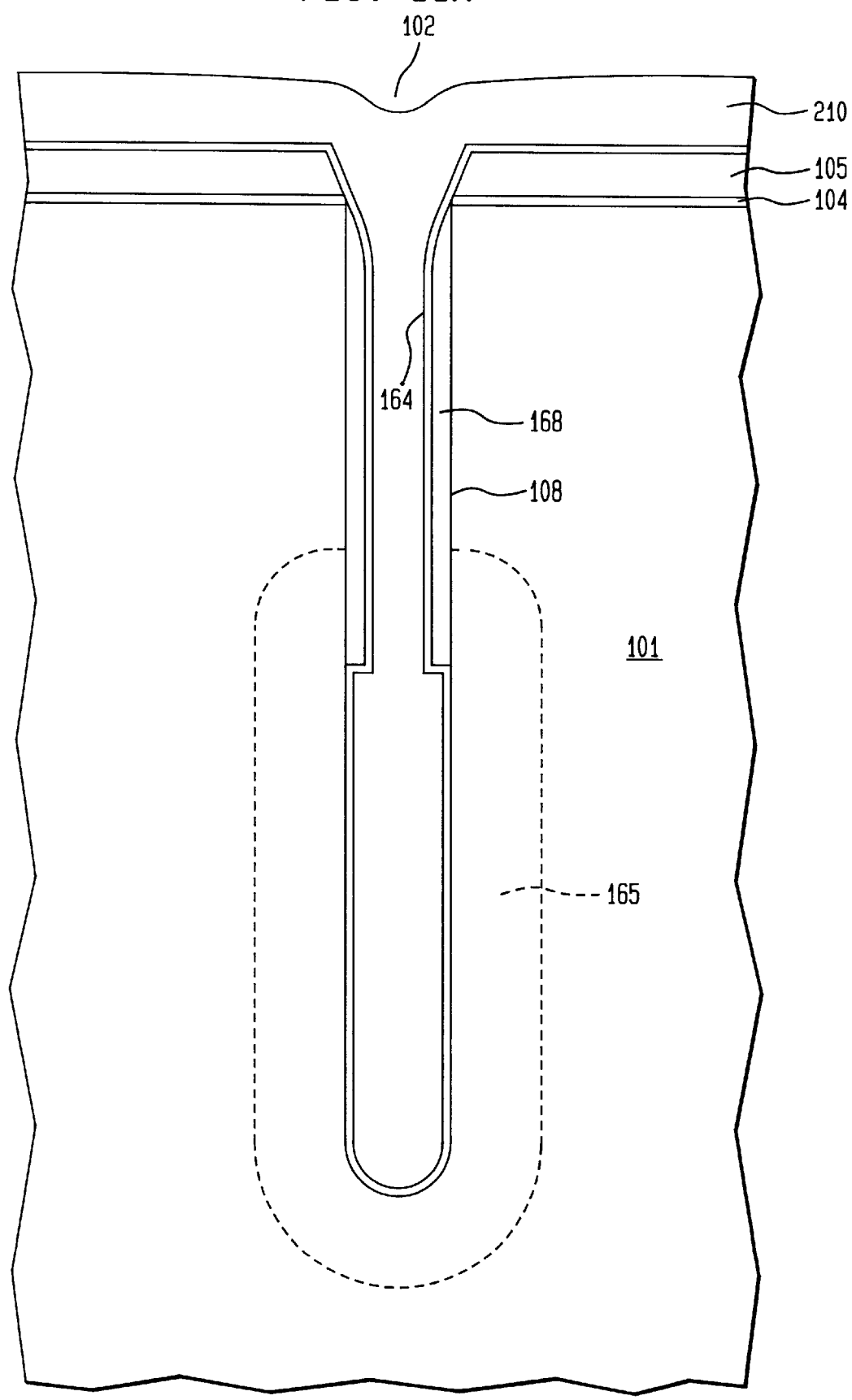
Figure 11B:
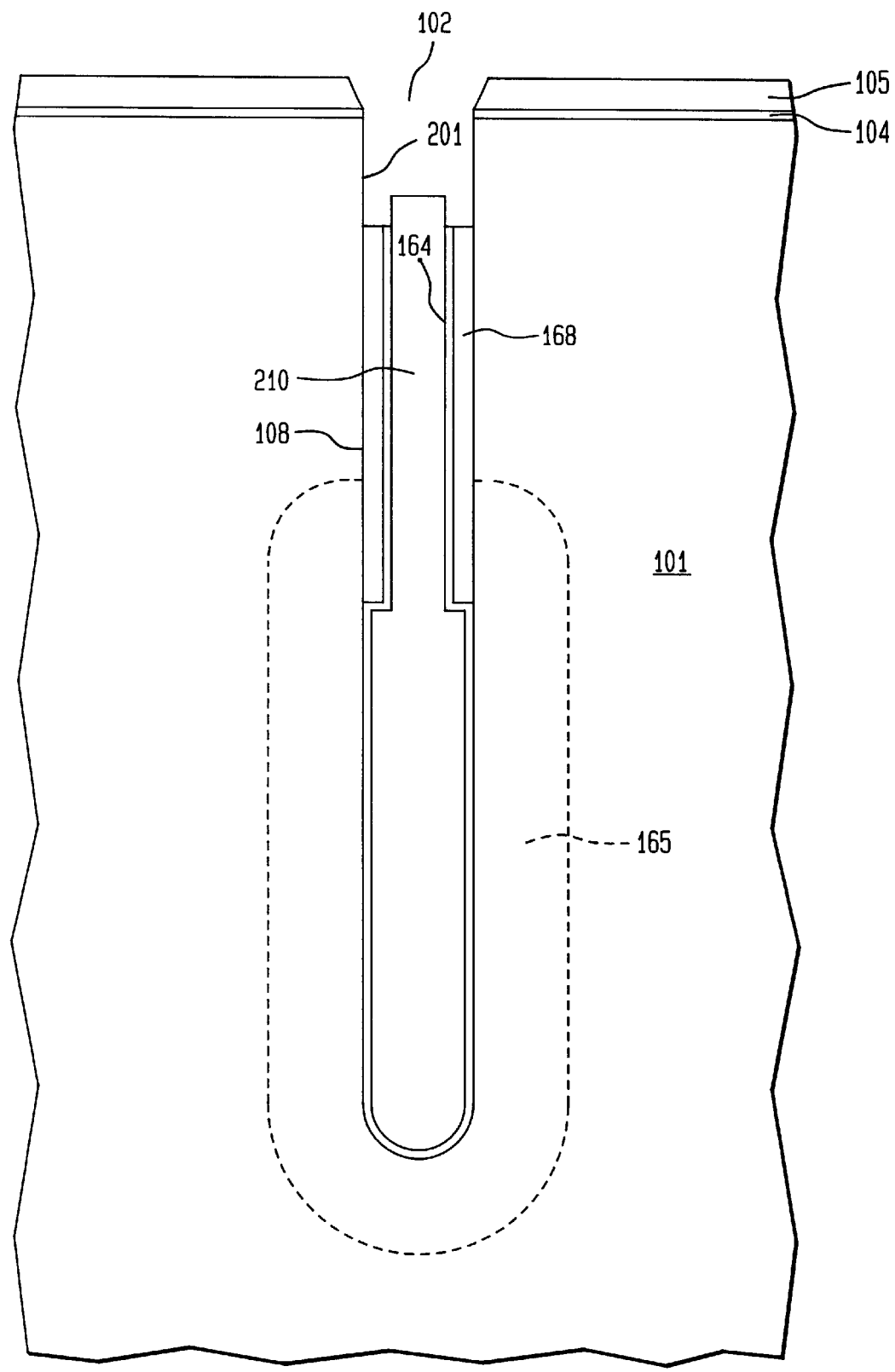
Figure 11C:
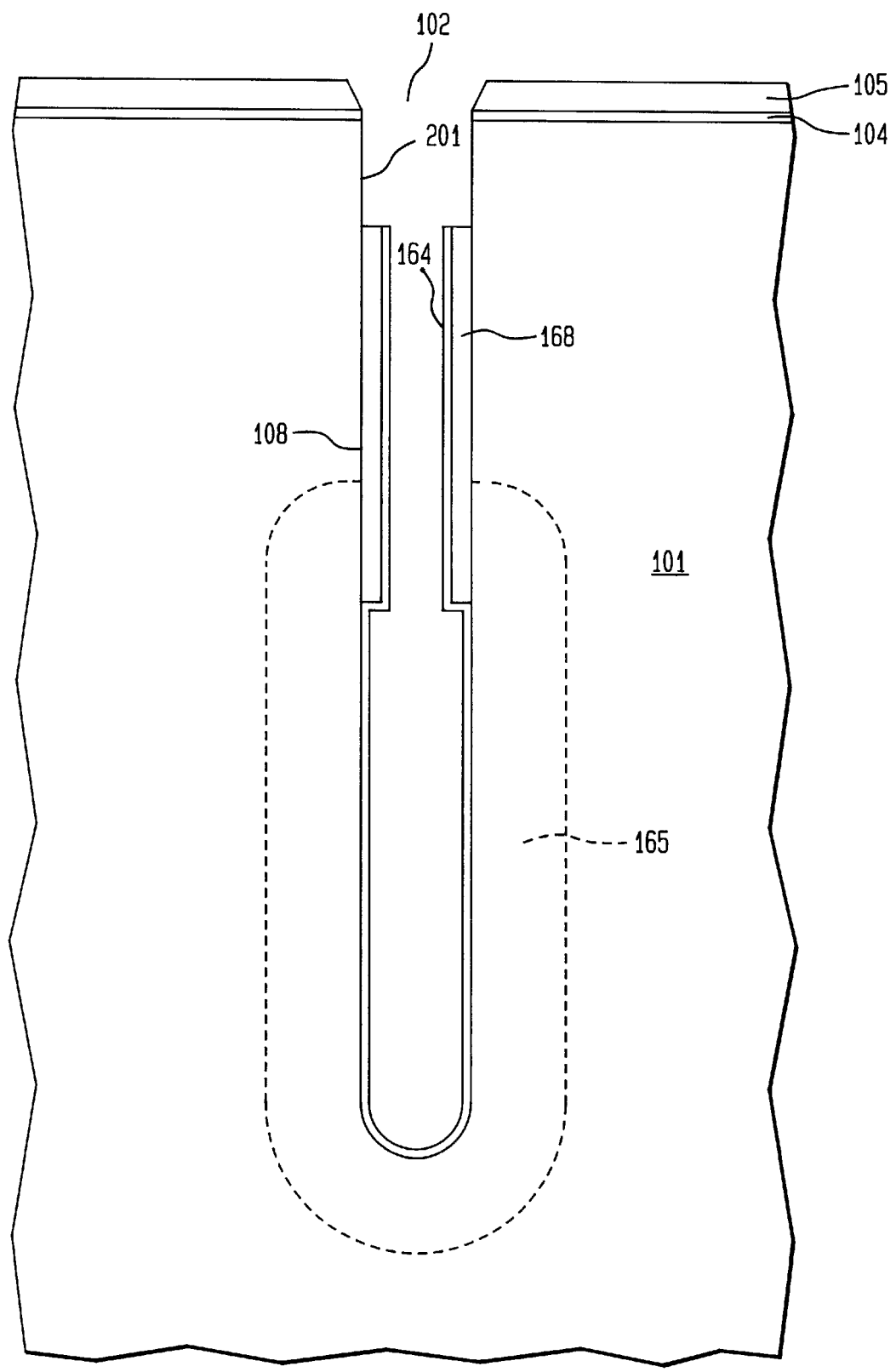
Figure 11D:
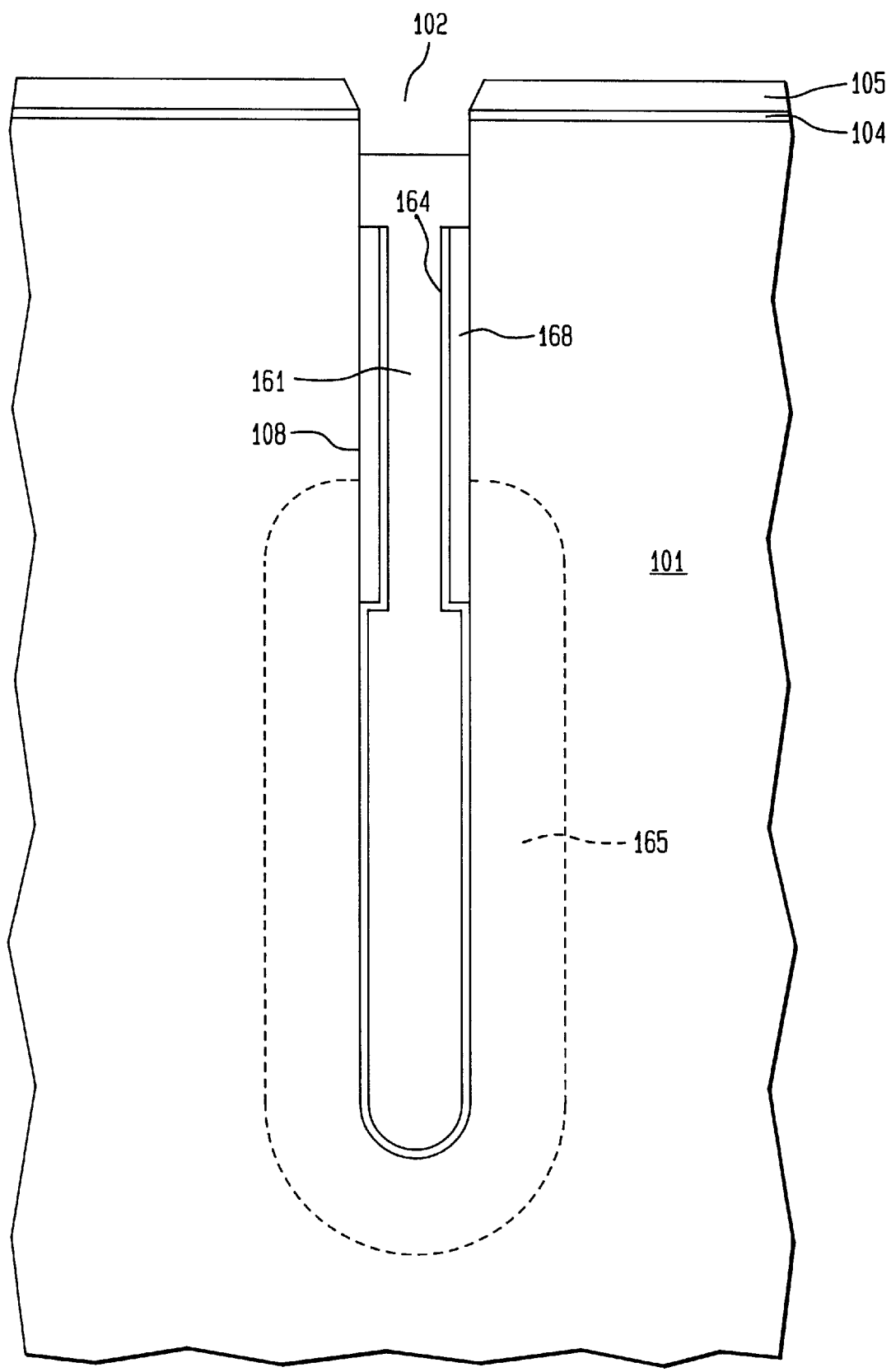
Figure 12:
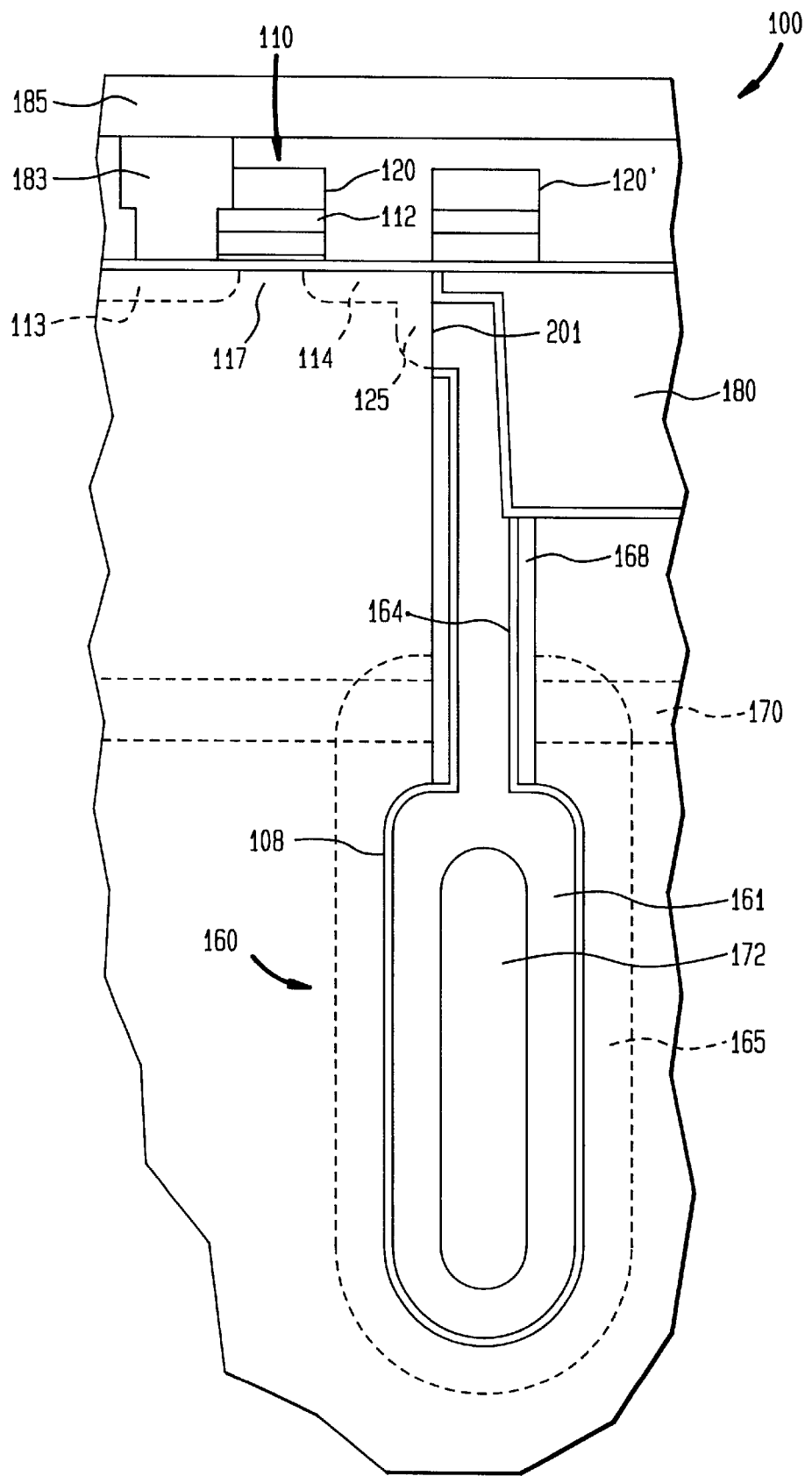

In the Figures:

FIG. 1 is a conventional DRA memory cell having a trench capacitor manufactured in a two-step etch process;

FIGS. 2a–c are process steps for manufacturing the conventional DRAM cell;

FIG. 3 is an embodiment of a DRAM cell according to the present invention;

FIGS. 4a–g depict a first embodiment of the inventive method for manufacturing the DRAM memory cell of FIG. 3;

FIG. 5 depicts another embodiment of a DRAM cell according to the present invention related to a second embodiment of the inventive method;

FIGS. 6a–c depict a third embodiment of the inventive method for manufacturing the DRAM memory cell of FIG. 3;

FIGS. 7a–c depict a fourth embodiment of the inventive method for manufacturing the DRA memory cell of FIG. 3;

FIGS. 8a–e depict a fifth embodiment of the inventive method for manufacturing the DRAM memory cell of FIG. 3;

FIGS. 9a–f depict a sixth embodiment of the inventive method for manufacturing the DRAM memory cell of FIG. 3;

FIG. 10 is another embodiment of a DRAM cell according to the present invention related to a seventh embodiment of the inventive method;

FIGS. 11a–d depict a seventh embodiment of the inventive method for manufacturing the DRAM memory cell of FIG. 10; and FIG. 12 is another embodiment of a DRAM cell according to the present invention related to an eighth embodiment of the inventive method.

Although applicable to any trench capacitors, the present invention and its underlying problems are explained with respect to a trench capacitor used in a DRA memory cell in the following. Such memory cells are used in integrated circuits (ICs) like, for example, random access memories (RAMs), dynamic RAMs (DRAMs), synchronous DRAMs (SDRAMs), static RAMs (SRAMs) and read only memories (ROMs). Other ICs include logic devices such as programmable logic arrays (PLAs), application-specific ICs (ASICs), merged logic/memory ICs (embedded DRAMs) or any other circuit devices. Typically, a plurality of ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAS) and other products. For purposes of discussion, the invention is described in the context of forming a single memory cell, A description of the manufacture of a conventional trench capacitor DRAM memory cell using a two-step etching process is provided before describing the invention.

Referring to FIG. 1, a conventional trench capacitor DRAM memory cell 100 is shown. Such a conventional trench capacitor DRAM memory cell is described in, for example, Nesbit et al., A 0.6 $\mu m^2$ 256 Mb Trench DRAM Cell With Self-Aligned Buried Strap (BEST), IEDM 93–627, which is herein incorporated by reference for all purposes.

The DRAM cell comprises a trench capacitor 160, formed in a substrate 101. The substrate is lightly doped with p-type dopants (p⁻), such as boron (B). The trench is filled with, typically, polysilicon 161 heavily doped with n-dopants (n⁺), such as arsenic (As) or phosphorous (P). Optionally, a buried plate 165 with, for example, As doping, is provided in the substrate surrounding the lower portion of the trench 108. The As is diffused into the silicon substrate 101 from a dopant source, such as ASG, which is formed on the sidewalls of the trench 108. The polysilicon 161 and the buried plate 165 serve as the electrodes of the capacitor. A node dielectric 164 separates these electrodes.

The DRAM cell 100 also comprises a transistor 110. The transistor 110 comprises a gate 112 and diffusion regions 113 and 114. The diffusion regions 113, 114, which are separated by a channel 117, are formed by implanting n-type dopants, such as phosphorous (P). A node junction diffusion region 125, referred to as "node junction", couples the capacitor 160 to the transistor 110. The capacitor junction diffusion region 125 is formed by outdiffusing dopants from the trench polysilicon 161 through a buried strap 162.

A collar 168 is formed at an upper portion of the trench 103. As used herein, the upper portion of the trench 108 is the section which includes the collar 168, and the lower portion of the trench is the section below the collar 168. The collar 168 prevents a leakage current of the node junction 162 to the buried plate 165. The leakage current is undesirable because it deteriorates the retention time of the memory cell, increasing the refresh frequency which adversely impacts performance.

A buried well 170 comprising n-type dopants, such as P or As, is provided below the surface of the substrate 101. The peak concentration of the dopants in the buried n-well 170 is at about the bottom of the collar 168. Typically, the well 170 is lightly doped compared to the buried plate 165. The buried well 110 serves to connect the buried plates 165 of the DRAM memory cells in the memory cell array.

Activation of the transistor 110 by providing the appropriate voltages at the gate 112 and the bitline 185 provides a connection to the trench capacitor 160. In general, the gate 112 is coupled to a wordline 120, and the diffusion region 113 is coupled to a bitline 185 in the DRAM array via a contact 183. The bitline 185 is isolated from the diffusion regions 113, 114 by an interlevel dielectric layer 189.

A shallow trench isolation (STI) 180 is provided to isolate the DRAM memory cell 100 from the other memory cells or other electric devices. As shown, another wordline 120' is formed over the trench 108 and isolated therefrom by the STI 180. The wordline 120' passing over the STI 180 is referred to as the "passing wordline". Such a configuration is referred to as a folded bitline architecture.

FIGS. 2a–c show a two-step trench etch process for forming the conventional trench capacitor of FIG. 1. Referring to FIG. 2a, a pad stack 107 is formed on the surface of substrate 101. The substrate 101 comprises the buried n-well 170 that is used to connect the buried plates of the trench capacitors. The pad stack 107 includes several layers, in particular a hard mask layer 106, a pad stop layer 105 and a pad oxide layer 104. The hard mask layer 106 is patterned using conventional photolithographic techniques to define a region 102 in which the trench is to be formed. A first RIE is performed to form the trench part 108a which has a depth equal to the depth of the collar 168.

An oxide layer 167, such as a thermal oxide layer, is deposited on the wafer, covering the pad stack 107 and the sidewalls of the trench. The oxide layer 167 serves as the collar 168. An anneal is performed to densify the oxide layer 167 in order to improve the quality of the oxide. This is usually done in an argon gas atmosphere at 1000° C.

Referring to FIG. 2b, the oxide 167 at the pad stack 107 and at the bottom of the trench is removed. For this purpose, for example, a RIE, such as an oxide plasma etchr is used. Thus, the collar 16B is formed.

As shown in FIG. 2c, a second RIE is performed in order to form the lower part 108b of the trench. The second RIE is, for example, a silicon plasma etch. The collar 168 acts as an etch mask during the RIE. As a result, the lower portion of the trench 108b has a width $W_2$, which is less than the width $W_1$ of the upper portion of the trench 108a. This is undesirable as it reduces the capacitance of the trench capacitor. Although, the second RIE may erode the upper portion of the collar, leading to a leakage which adversely impacts the retention time of the capacitor.

After the formation of the lower portion of the trench, the n-type buried plate 165 is optionally formed. The buried plate is formed by, for example, gas phase doping, plasma doping or ion implantation. Alternatively, doped silicate glass is deposited to line the trench sidewalls to provide a dopant source from which dopants diffuse into the substrate 101 by a drive-in anneal. Removal of the doped silicate glass is achieved by, for example, chemical etching with BHF.

Then, the memory cell is completed by depositing a node dielectric layer (not shown) on the wafer covering the sidewalls of the trench. The trench is then filled with polysilicon also covering the surface of the wafer. The polysilicon is heavily doped with n-type dopants.

Finally, the remaining parts of the DRAM cell are formed with conventional process steps, so as to form the conventional structure shown in FIG. 1. The remaining process steps includes the partial removal of the polysilicon, the collar 168 and the node dielectric 164 in the trench and forming the strap 162, defining the isolation region to form the STI 180, depositing and patterning the various layers comprising the gate stack 112, depositing an interlevel dielectric layer 189, creating contact opening and forming the bitline 185. these process steps are, for example, described in Nesbit et al., A 0.6 $\mu m^2$ 256 Mb Trench DRAM Cell With Self-Aligned Buried Strap (BEST), IEDM 93–627 and in El-Kareh et al., Solid State Technology, p-89, May 1997.

Now referring to FIG. 3, an embodiment of a DRAM cell according to the present invention and referring to FIGS. 4a–g, a first embodiment of the inventive method for forming the DRAM memory cell of FIG. 3 will be described.

The inventive trench capacitor of FIG. 3 comprises a node dielectric 164 that is formed in step-form over the collar 168, eliminating the need to remove the upper portion of the node dielectric layer. This avoids the formation of pinholes at the transition of the collar and the upper edge of the node dielectric layer. Additionally, the lower portion of the trench comprises a width or diameter $W_2$ which is at least equal to about the width or diameter $W_1$ of the upper portion. As such, reduced leakage currents and increased capacitance is achieved, FIG. 3 shows a trench capacitor 160 implemented in a DRAM memory cell 100 in accordance with a first embodiment of the invention. In a non-limiting sense, the DRAM memory cell 100 is a MINT cell (MINT=merged isolation node trench) with a buried strap 162. Other cell configurations, such as those utilizing a surface strap, are also useful. The typical dimensions of a trench 108 as implemented in, for example, a 256 megabit DRAM chip using 0.25 $\mu$m design rules is about 7–8 $\mu$m deep, with a trench opening of about 0.25 $\mu$m by 0.5 $\mu$m.

As shown in FIG. 3, the trench capacitor 160 is formed in the substrate 101. The substrate, for example, is lightly doped with dopants having a first electrical type. In this embodiment, the substrate 101 is lightly doped with p-type dopants (p⁻), such as B. The use of a heavily doped p-type substrate (p⁺) is also useful. For example, p⁺/p⁻-epitactical substrates can be used. Such substrates have a dopant concentration of about $10^{19}$ cm⁻³ having a p⁻-epitaxial layer of typically 2–3 $\mu$m thickness. The concentration of B is about $1.5 \times 10^{16}$ cm⁻³. A p-type well (not shown) is provided for isolating the array devices. The dopant concentration of the p-wells is about $5 \times 10^{17}$–$8 \times 10^{17}$ cm⁻³.

In this embodiment, the lower portion of the trench has a width or diameter $W_2$ which is effectively about equal to or greater than about the width or diameter $W_1$ of the upper portion, in contrast to the above-mentioned trench capacitor formed by the two-step trench etch method. Optionally, the buried plate 165 surrounds the lower portion of the trench 108. As shown, the buried plate 165 partially overlaps with the upper portion of the trench. The buried plate 165 serves as an electrode of the capacitor. Typically, the trench comprises polysilicon 161 heavily doped with a dopance having a second electrical type. For example, the polysilicon is heavily doped with n-type dopants (n⁺), such as As or P. In one embodiment, the polysilicon 161 is heavily doped with As. The concentration of As is about $10^{19}$–$10^{20}$ cm⁻³.

The node dielectric layer 164 separates the electrodes of the capacitor. In this embodiment, the node dielectric 164 lines the inner sidewalls of the collar 168 and the trench sidewalls in the lower portion of the trench. The node dielectric 164 comprises, for example, nitride or nitride/oxide. Oxide/nitride/oxide or other suitable dielectric layer or stack of layers, such as oxide, nitridized oxide or NONO are also useful.

The connection of the buried plate 165 of the capacitor with other capacitors within the DRAM array is achieved by the buried well 170 comprising dopants of second conductivity. In the present embodiment, the buried well 170 is formed by implantation of n-type dopants, such as As or P. The concentration of the buried well 170 amounts to about $1 \times 10^{17}$–$1 \times 10^{20}$ cm⁻³. The buried well 170 may also be formed with an n-type epitaxial layer and is connected to a reference voltage. By connecting the buried plates 165 of the capacitors in the DRAM array to a common reference voltage, the maximum electrical field in the dielectric layer 164 is minimized, thus improving the reliability. In this embodiment, the reference voltage is midway between the bitline low and high voltage limits, commonly referred to as $V_{DD}/2$. Other reference voltages, such as ground potential, are also applicable.

The strap 162 is provided above the doped polysilicon 161. Dopance from the doped polysilicon 161 outdiffuse into the silicon, forming then node junction diffusion region 125 or the node junction, connecting the transistor 110 and the capacitor 160.

The collar 168 is provided in the upper portion of the trench 108 and extends to the top of buried plate 165. As shown, the collar 168 is slightly recessed below the substrate 101 surface to accommodate the buried strap 162. The collar 168 comprises a dielectric material. In the present embodiment, a thermal oxide layer is first formed and then a TEOS layer is deposited thereon. The collar 168 prevents or reduces leakage from the node junction to the buried plate. In one embodiment, the collar is about 1.2 $\mu$m deep and 20–90 nm thick.

The STI 180 is provided in the top portion of the trench 108 to isolate the DRAM cell from other cells in the array and to prevent strap formation between adjacent capacitors. As shown, the STI 180 overlaps a portion of the trench 108, leaving the remaining portion to permit current to flow between the transistor 110 and capacitor 160. In this embodiment, the STI 180 nominally overlaps about half the trench width. The STI prevents or reduces strap to strap leakage current. The depth of the STI is about 0.25 $\mu$m.

The buried strap 162 of this embodiment comprises an interface polysilicon fill/buried strap denoted with 200 and an interface buried strap/substrate denoted as 201, which will be discussed in more detail in an embodiment described below.

The transistor 110 comprises the gate stack 112 and the drain/source diffusion regions 113 and 114. The diffusion regions 113, 114 include n-type dopants, such as As or P, The diffusion region 114 is connected to the node junction 125. The gate stack 112 which is connected to the wordline 120 comprises a polysilicon layer. Typically, the polysilicon is doped with n- or p-type dopants. Optionally, a metal silicide layer (not shown) is formed over the polysilicon layer to reduce the sheet resistance of the gate stack 112. The polysilicon and the suicide are sometimes referred to as "polycide".

The gate stack 112 is capped with a nitride layer that is used as an etch mask to isolate the wordline. Additionally, sidewall oxide (not shown) and a liner are used to isolate the wordline 120. The liner, for example, comprises nitride or other suitable material. The liner also serves as an etch stop during the formation of the borderless contact 183. The borderless contact provides a connection between the diffusion region 113 and the bitline 185. The dielectric layer 189, such as BPSG or other dielectric material, such as oxide, isolates the bitline 185 from the diffusion regions 113, 114.

The passing wordline 120' is formed above the STI trench 180. The passing wordline 120' is isolated from the trench 10 by the STI 180 and a thick cap oxide. In this embodiment, the edges of the passing wordline are substantially aligned with the trench sidewalls. Such configuration is referred to as a folded bitline architecture. Other configurations, such as, for example, open or open-folded architecture, are also useful.

As described, the first electrical type is p-type and the second electrical type is n-type. The invention is also applicable to trench capacitors having p-type polysilicon formed in an n-type substrate. Further, it is possible to heavily or lightly dope the substrate, wells, buried plate and other elements of the DRAM cell with impurity atoms to achieve the desired electrical characteristics, Although the first electrical type is the p-type and the second electrical type is the n-type, forming the DRAM cell in an n-type substrate with a p-type polysilicon filled trench is also useful. Additionally, the use of a vertical transistor or other types of cell layouts is also useful FIGS. 4a–g show a first embodiment of the inventive method for manufacturing the DRAM memory cell of FIG. 3.

Figure 4A:
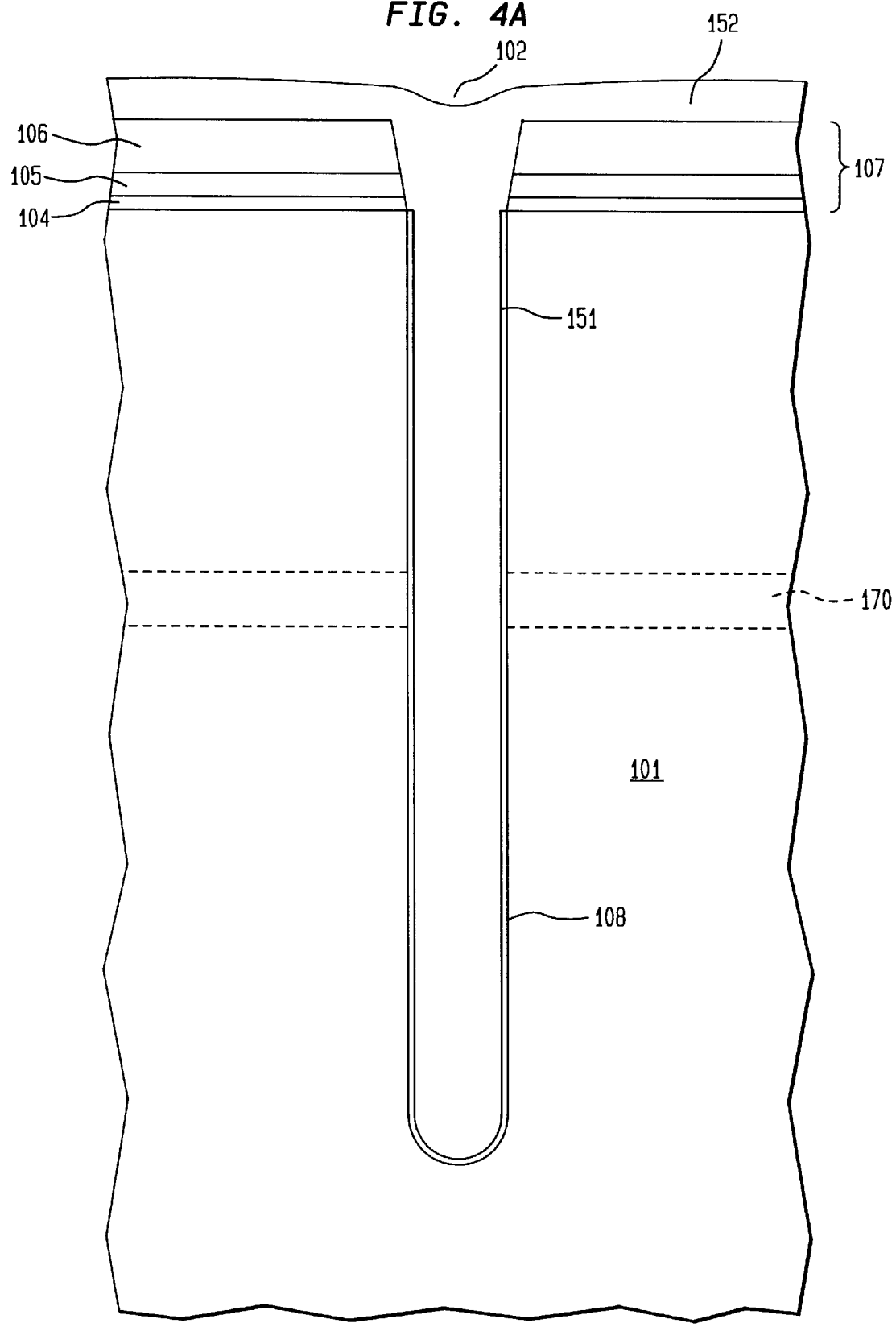

Referring to FIG. 4a, the substrate 101 is provided on which the DRAM memory cell is to be fabricated. The major surface of the substrate is not critical, and any suitable orientation, such as a (100), (110) or (111) is useful. In this embodiment, the substrate 101 is lightly doped with p-type dopants (p$^-$), such as B. The concentration of B is about $1-2\times10^{16}$ cm$^{-3}$.

The substrate IQI also includes the n-type buried well 170. The buried well 170 comprises P or As as dopant. In this embodiment, a mask is patterned to define the buried well regions. N-type-dopants are then implanted into buried well regions of the substrate 101. The buried well 170 serves to isolate the p-well from substrate 101 and also forms a conductive bridge between the buried plates 165 of the capacitors. The concentration and energy of the implant is about >1×10$^{13}$ cm$^{-2}$ at about 1.5 MeV. Alternatively, the buried well 170 is formed by implanting and then growing an epitaxial silicon layer above the substrate surface. Such technique is described in U.S. Pat. No. 5,250,829 to Bronner et al. which is herein incorporated by reference for all purposes.

The pad stack 107 is formed on the surface of the substrate 101. The pad stack 107 comprises, for example, the pad oxide layer 104 and the pad stop layer 105. The pad stop layer 105, which serves as a polish or etch stop for subsequent processes for example comprises nitride. Above the stop pad stop layer 105, there is the hard mask layer 106. The hard mask layer 106 comprises TEOS. Other materials, such as BSG, are also useful to serve as the hard mask layer. Additionally, an anti-reflective coating (ARC) may be used to improve the lithographic resolution.

The hard mask layer 106 is patterned using conventional lithographic techniques to define the region 102 in which the trench is to be formed. These steps include depositing a layer of resist and selectively exposing it with the desired pattern. The resist is then developed and either the exposed or unexposed portions are removed, depending on whether a positive or negative resist is used. The exposed portions of the pad stack 107 are then etched to the surface of the substrate 101. A reactive ion etch (RIE) then forms the deep trench 108.

A polysilicon semiconductor layer 152 is deposited on the wafer, filling the trench 108. Amorphous silicon is also useful. Other types of material which have a temperature stability up to about 1050 to 1100° C. and can be removed selectively to nitride or oxide are also useful. The polysilicon 152 is referred to as a sacrificial polysilicon layer since it is subsequently removed. Typically, a native oxide 151 is formed lining the trench sidewalls before the trench is filled with polysilicon 152. The oxide layer 151 is typically about 0.3–5 nm thick.

Figure 4B:
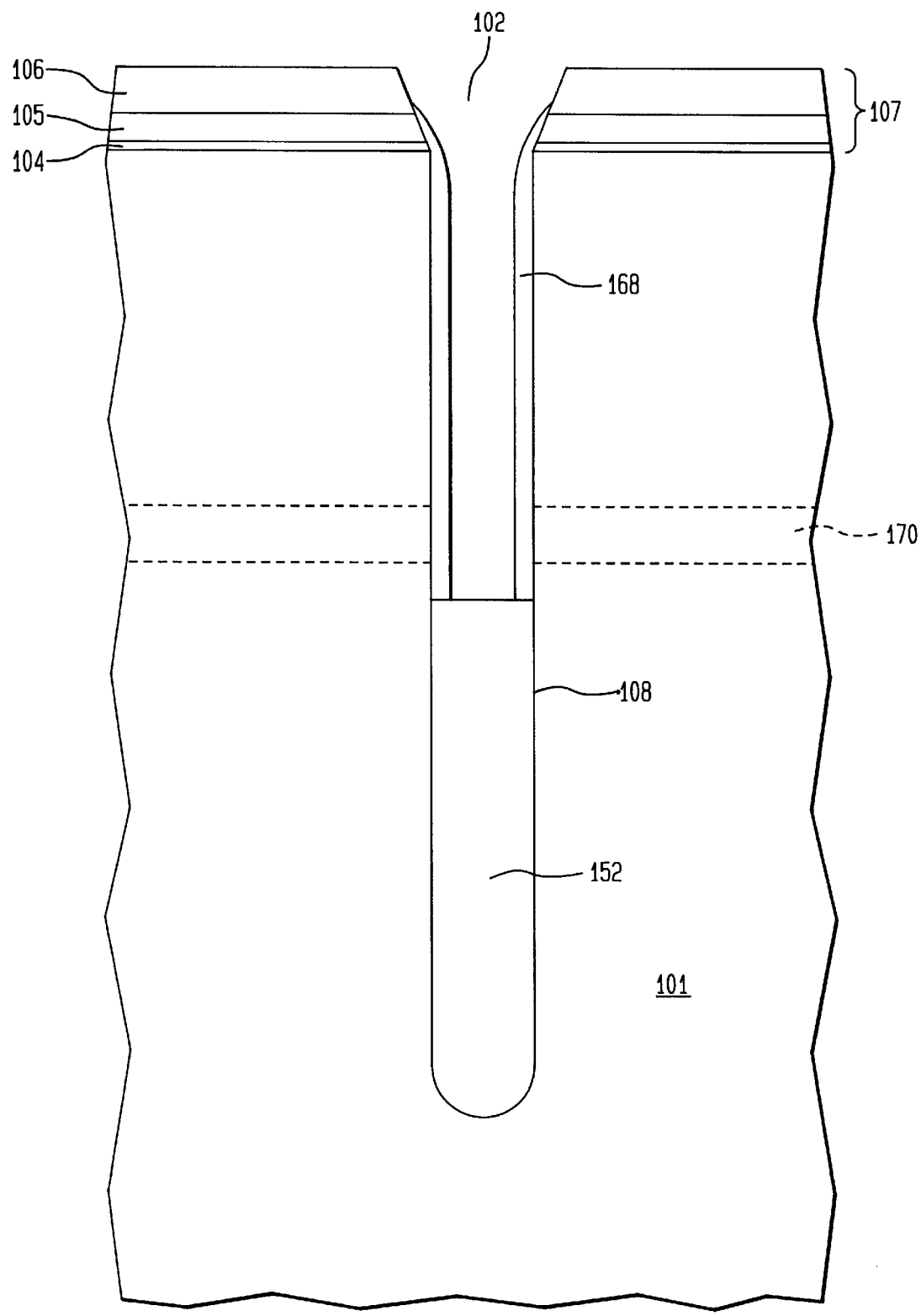

As shown in FIG. 4b, the polysilicon 152 is then recessed to about the bottom of the collar 168 to be formed. Recessing the polysilicon 152 includes, for example, planarizing it by CMP (chemical mechanical polishing), chemical dry etch (CDE) or RIE to form a coplanar surface with a top of the polysilicon in the trench 108 and the top of the pad stack 107. An RIE is performed to recess the polysilicon 152 in the trench 108. The use of a CDE to recess the polysilicon 152 in the trench 108 is also useful. Preferably, however, the polysilicon 152 is planarized and recessed by a CDE or a RIE in a single step, typically to about 0.5–2 µm from the substrate surface.

A dielectric layer is then deposited over the wafer, covering the pad stack 10 and the trench sidewalls. The dielectric layer is used to form the collar 168. The dielectric layer comprises, for example, oxide, In this embodiment, the dielectric layer is formed by first growing a layer of thermal oxide and then depositing an oxide layer by chemical vapor deposition (CVD) such as plasma-enhanced CVD (PFCVD) or low pressure CVD (LPCVD) using TEOS, The CVD oxide may be densified by an anneal. The oxide layer is sufficiently thick to prevent vertical leakage, normally about 10–50 nm. Alternatively, the dielectric layer comprises a layer of thermal oxide.

In another embodiment, the dielectric layer is formed from CVD oxide. After formation of the CVD oxide, an anneal my be performed to densify the oxide. The anneal is performed in, for example, Ar, $N_2$, $O_2$, $H_2O$, $N_2O$, NO or $NH_3$ ambient. An oxidizing ambient such as $O_2$ or $H_2O$ may be used to form a thermal oxide layer beneath the CFD oxide. Oxygen from the ambient diffuses through the CVD oxide to form a thermal oxide layer on the substrate surface. This advantageously enables the formation of a thermal oxide, if desired, without needing a thermal oxidation step prior to the deposition of the CVD oxide. Typically, the anneal is performed at a temperature of about 1000–1100° C. for about 0.5–3 hours.

Further with reference to FIG. 4b, the dielectric layer is etched by, for example, RIE to open the collar 16B. The chemical means for reactive ion etching are selected such that the oxide is selectively etched with respect to the polysilicon 152 and the nitride 106. The RIE removes the dielectric layer from the surface of the pad stack and the bottom of the opening. The dielectric layer remains on the silicon sidewall, forming the collar 468. As depicted in FIG. 4b, the top portion of the collar 168 is slightly eroded, forming to a taper top portion.

Figure 4C:
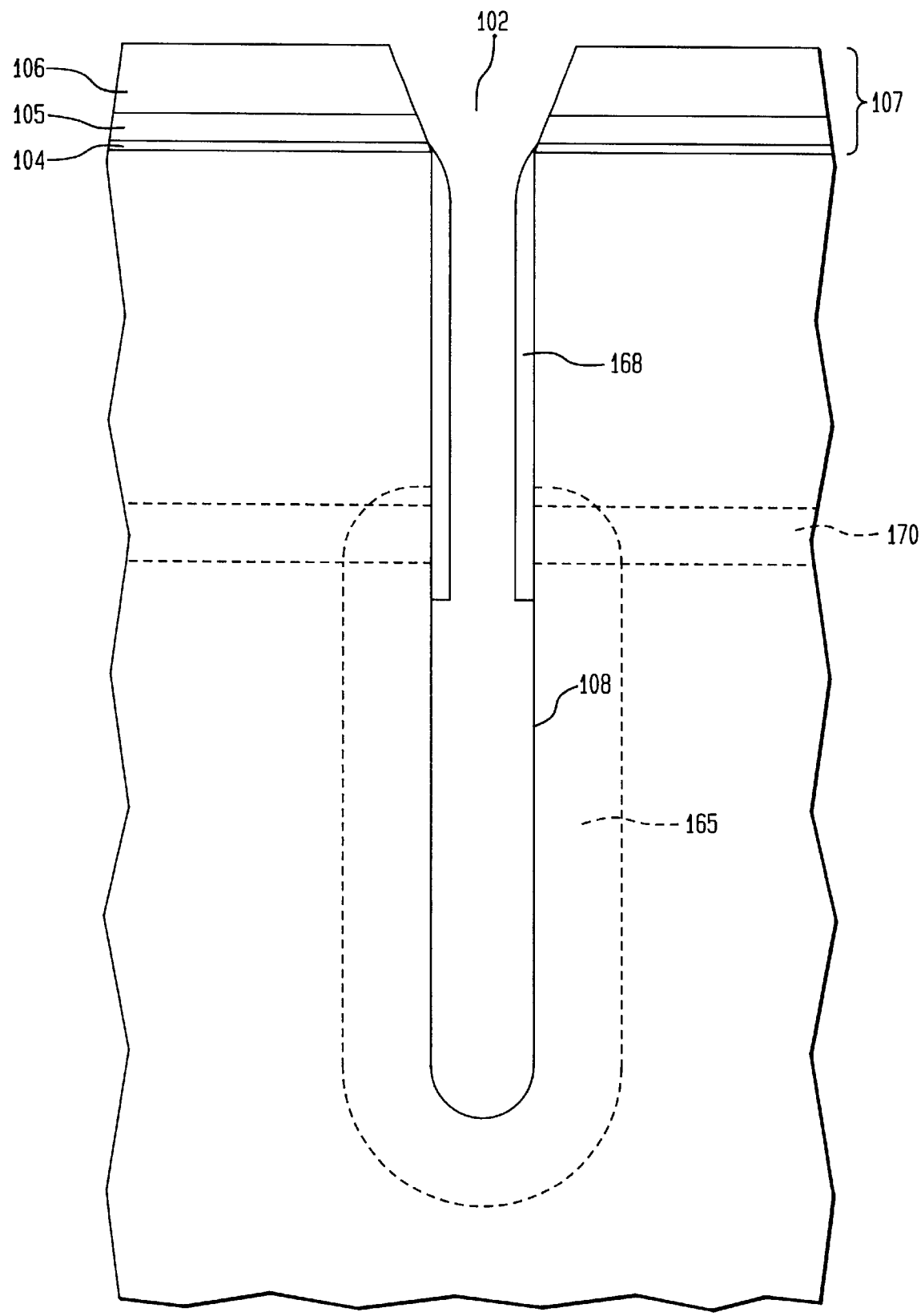

Referring to FIG. 4c, the sacrificial polysilicon layer 152 is removed from the bottom of the trench 108. Removal of the sacrificial polysilicon layer 152 is achieved preferably by CDE. The thin native oxide layer 151 is typically present on the exposed trench sidewalls. This thin native oxide layer 151 may be sufficient to serve as a CDE etch stop, A CDE using, for example, $NE_3+Cl_2$ chemistry can etch silicon or polysilicon with relatively high selectivity to oxide, enabling the removal of the polysilicon by using the thin native oxide layer 151 as an etch stop. For example, a selectivity of about 4000:1 has been found to be effective in removing the polysilicon from the trench 108 using the native oxide 151 as an etch stop layer.

In another embodiment, a CDE step with high $Cl_2$ contents is employed to increase the silicon or the polysilicon etch selectivity to oxide. A flow rate of about 12 sccm results in effectively zero oxide etch rate while the polysilicon etch rate is in the order of about 2 µm/min. This enables the native oxide layer 151 to serve as an effective etch stop for the removal of the sacrificial polysilicon. Typically, the thickness of native oxide 151 should be 0.5 to 1 nm.

Alternatively, a wet etch employing, for example, KOH or $HF:HNO_3:CH_3COOH$ is also useful in removing the polysilicon. However, the use of KOH can lead to K-contamination on the trench sidewall which may require an additional clean step. An RIE is also useful in removing the polysilicon, since it is anisotropic, Suitable chemistry for the RIE removal of the polysilicon includes $SF_6/NH_3/HBr$.

Other appropriate chemistry that etches polysilicon selectively to oxide or nitride such as $NF_3/HBr$ or $CF_4/O_2$ or $CF_4/O_2/Cl_2$ is also suitable.

The RIE etch selectivity of polysilicon to oxide or nitride is about less than 100:1 on planar surfaces, but increases to greater than about 2000:1 on vertical surfaces due to the predominantly vertical direction of the motion of the ions during the RIE etch. Due to the high selectivity of the polysilicon to oxide or nitride on the vertical surfaces, only the upper portion of the collar 168 is eroded. However, this is not a problem since the collar 168 is not eroded below the surface of the substrate.

After removal of the polysilicon, the buried plate 165 comprising n-type dopants such as As or P is optionally formed to serve as the second electrode. The collar 168 serves as an isolation mask allowing only the region below the collar 168 to be doped. The concentration of the dopants is about $1\times10^{19}$–$10^{20}$ cm$^{-3}$. To form the buried plate, gas phase doping using $PH_3$ or $AsH_3$, plasma doping or plasma immersion ion implantation (PIII) is employed. Such techniques are described in, for example, Ransom et al., J. Electrochemical. Soc. Vol. 141, No. 5 (1994), pp. 1378; U.S. Pat. No. 5,344,381; and U.S. Pat. No. 4,937,205, which are herein incorporated by reference for all purposes.

Ion implantation using the collar 168 as isolation mask is also useful. Alternatively, the buried plate 165 is formed using a doped silicate glass such as ASG as a dopant source. The use of doped silicate glass as a dopant source is described in Becker et al., J. Electrochemical. Soc., Vol. 136 (1989), pp. 3033, which is herein incorporated by reference for all purposes. When doped silicate glass is employed, the layer is removed after the formation of the buried plate.

Figure 4D:
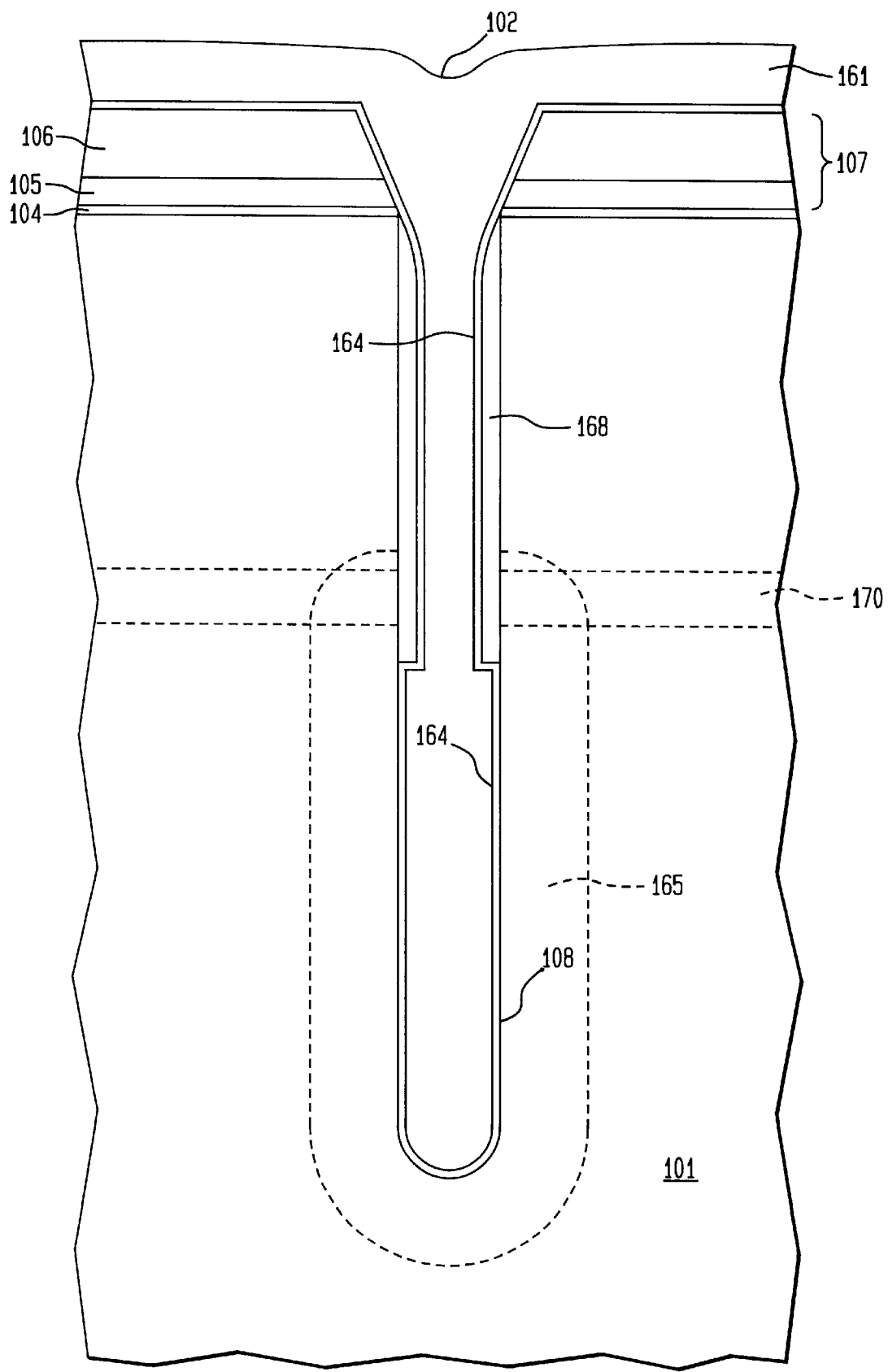

Referring to FIG. 4d, a node dielectric layer 164 is deposited on the wafer, covering the surface of the pad stack 107 and the interior of the trench 108. The node dielectric layer 164 serves as the node dielectric used to separate the plates of the capacitor. In one embodiment, the dielectric layer comprises an NO film stack. The NO film stack is formed by depositing a nitride layer which is then reoxidized, The nitride layer is formed by, for example, thermal nitridation and CVD nitride to a thickness of about 5 nm. The nitride layer is reoxidized at, for example, a temperature of about 900° C. The reoxidation of the nitride layer increases the thickness of the nitride marginally. Other types of dielectrical film stacks, such as oxide—nitride—oxide (ONO) or oxide—nitride—oxide—nitride (ONON), are also useful. Also, the use of a thin oxide, nitride or nitrided oxide film is also useful.

Another polysilicon layer 161 is deposited on the surface of the wafer for filling the trench 108 an covering the pad stack 107, namely by CVD or other known techniques. As shown, the polysilicon layer 161 is conformable and doped with n-type dopant such as P and As. In an embodiment, the polysilicon layer 161 is doped with As. The concentration of As is about $1\times10^{19}$–$1\times10^{20}$ cm$^{-3}$. The doped polysilicon 161 serves as an electrode of the capacitor. Alternatively, the layer may be made of amorphous silicon. This material may either be doped in situ or sequentially.

Referring to FIG. 4e, the polysilicon layer 161 is recessed by, for example, CDE or RIE using suitable chemistries such as $NF_3/Cl_2$ or $NF_3/HBr$ or $SF_6$. In another embodiment, the polysilicon 161 is recessed to about the level of the pad nitride 106. This advantageously protects the pad oxide 105 during subsequent wet etch processes. If undercut is not a problem the polysilicon can be recessed to the depth of the buried strap.

Figure 4F:
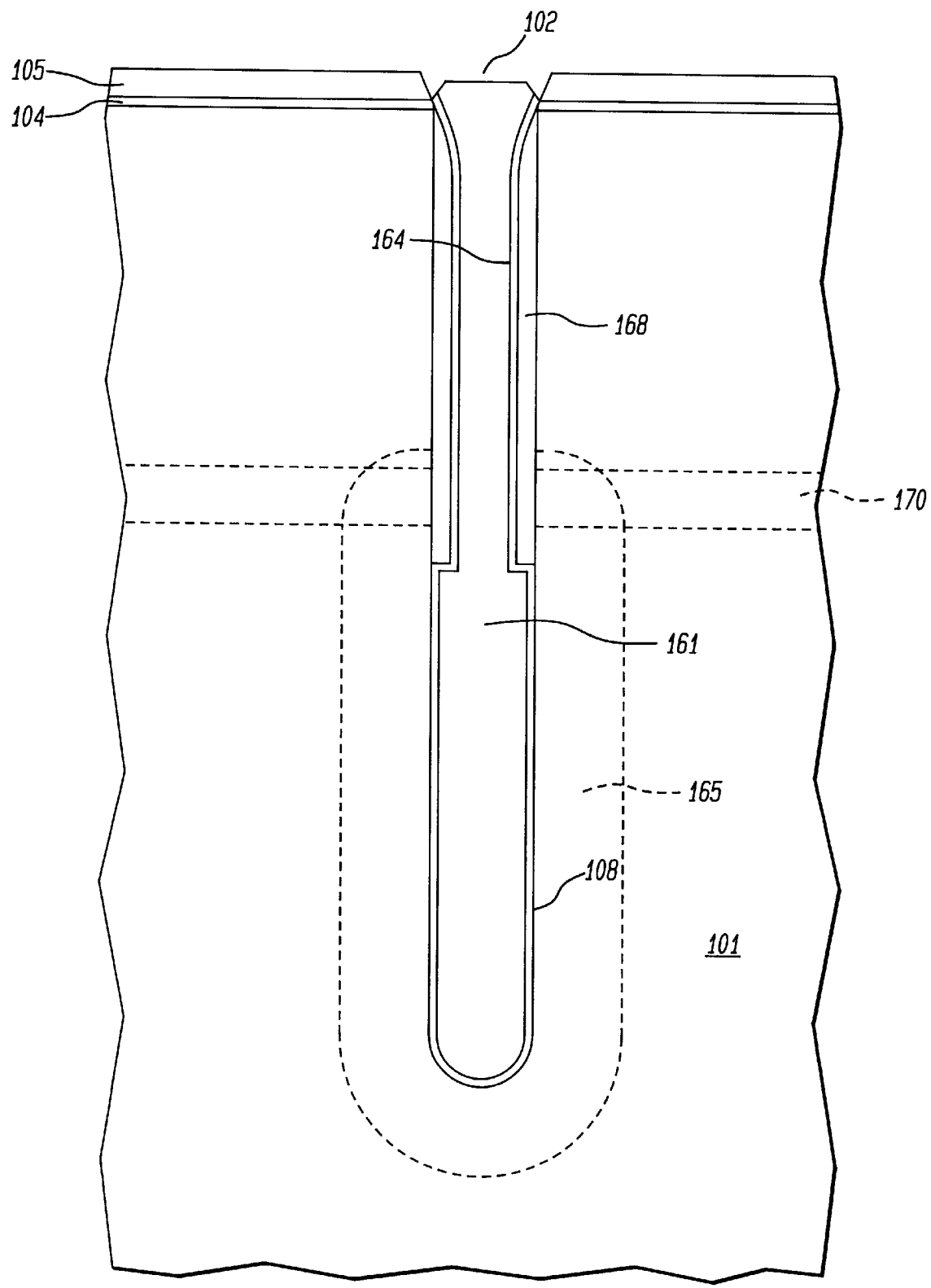

In FIG. 4f, the residual node dielectric layer 164 above the polysilicon 161 is removed by a wet etch with, for example, DHF and HF/glycerol. The hard mask layer 106 is then stripped by a wet etch using, for example, BHF. The use of CDE to remove the hard mask layer 106 is also possible. The Ihard mask layer may also be removed in an earlier process stage, such as after forming the deep trench 108. As shown, the collar 168 and the dielectric layer 164 in the trench 108 are also slightly recessed.

Figure 4G:
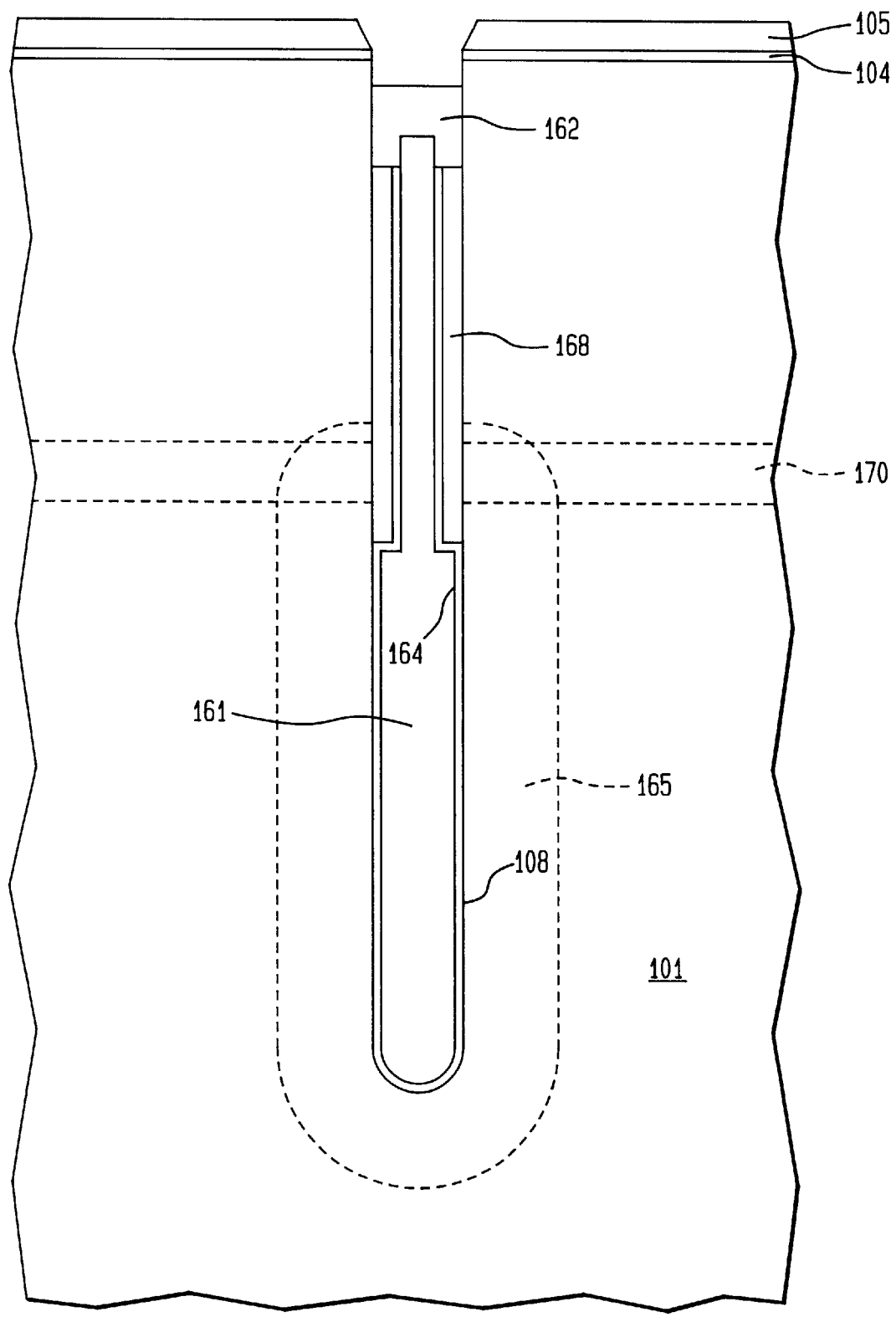

As shown in FIG. 4g, the buried strap 162 is formed. Formation of the buried strap 162 is achieved by, for example, an etch to recess the doped polysilicon 161 in the trench. Typically, the etch is an RIE. The non-active region of the cell is then defined by a conventional photolithographic technique and then anisotropically etched by, for example, RIE. The non-active region is a region where STI 180 is to be formed.

Again with reference to FIG. 3, the STI 180 overlaps a portion of the trench, cutting off part of the strap 162. In a subsequent anneal, dopants from the doped polysilicon 161 diffuse upwards and outwards through the strap 162 to form the diffusion region 125. The depth of the SDI is about 0.25 $\mu$m. Typically, the non-active region is etched below the top of the oxide of the collar 168. In one embodiment, the non-active region is etched about 0.25 $\mu$m below the substrate surface.

After the non-active region is etched, the resist and ARC layers are removed. To ensure that no resist or ARC residues remain, clean steps may be employed. To prevent that oxygen. diffuses into the silicon and poly sidewalls, an optional (not shown) liner is provided to protect the non-active region. The liner comprises, for example, nitride. Typically, a passivation oxide is thermally grown on the exposed silicon prior to forming the nitride liner. The nitride liner is formed by, for example, low pressure chemical vapor deposition (LPCVD).

A dielectric material is formed on the surface of the substrate. The dielectric material, for example, comprises $SiO_2$. In another embodiment, the dielectric material is TEOS, High density plasma (HDP) oxide or other suitable isolation material is also useful. The thickness of the dielectric layer is sufficient to fill the non-active region. Since the dielectric layer is typically conformable, planarization schemes such as CMP are employed. Such schemes are described in Nesbit et al., A 0.6 $\mu m^2$ 256 Mb Trench DRAM Cell with Self-Aligned Buried Strap (BEST), IEDM 93–627, which is already herein incorporated by reference for all purposes. The surface of the substrate 101 is then polished so that the STI 180 and nitride layer are substantially planar.

The pad stop layer 105 is then removed by, for example, wet chemical etch. The wet chemical etch is selective to oxide.

The pad oxide 104 is also removed at this point by wet chemical etch selective to silicon. After removal of the pad oxide 104, an oxide layer is formed on the surface of the wafer. The oxide layer, referred to as gate sacrificial layer serves as a screen oxide for subsequent implants.

To define a region for a p-type well for the n-channel transistor 110 of the DRAM memory cell, a photoresist layer is deposited on top of the oxide layer and appropriately patterned to expose the p-well region. As shown, p-type dopants, such as boron (B) are implanted in the well region. The dopants are implanted sufficiently deep to prevent punchthrough and to reduce sheet resistance. The dopant profile is tailored to achieve the desired electrical characteristics, e.g. a desired gate threshold voltage ($V_{th}$).

In addition, p-type wells for n-channel support circuitry are also formed. For complimentary wells in complimentary metal oxide silicon devices (CMOS), n-wells are formed. Formation of n-type wells requires additional photolithographic and implant steps to define and form the n-type wells. As with the p-type wells, the profile of the n-type wells are tailored to achieve the desired electrical characteristics. After formation of the wells, the gate sacrificial layer is removed.

The various layers for forming the gate 112 of the transistor 110 are formed. This includes forming a gate oxidation layer that serves as a gate oxide, a polysilicon layer and a cap nitride layer. Typically, the polysilicon layer may include a metal silicide layer, such as $WSi_x$, forming a polycide to reduce sheet resistance. The various gate layers are then patterned to form the gate stack 112 of the transistor 110. The sidewall of the gate stack is then isolated, for example, by thermal oxidation.

A passing gate stack as wordline 120' is typically formed over the trench and isolated therefrom by the STI 180. Source/drain diffusion regions 113 and 114 are formed by implanting n-type dopants, such as P or As. In one embodiment, P is implanted into the source and drain regions 113, 114. The dose and energy are chosen to produce a dopant profile which achieves the desired operating characteristics. To improve diffusion and alignment of the source and drain to the gate, nitride spacers (riot shown) may be employed. The diffusion region 114 connects to the diffusion region 425, forming the node junction.

The dielectric layer 189 is formed over the wafer surface, covering the gates 112 and the substrate surface. The dielectric layer, for example, comprises BPSG. Other dielectric layers, such as TEOS, are also useful. As shown, a borderless contact opening 183 is etched to expose the diffusion region 113. The contact opening is then filled with a conductive material, such as $n^+$-doped polysilicon, forming a contact stud therein. The metal layer 185 representing a bitline is formed over the dielectric layer, making contact with the source via the contact stud. Thus, the structure shown in FIG. 3 is finally obtained.

FIG. 5 shows another embodiment of a DRAM cell according to the invention related to a second embodiment of the inventive method.

As shown, the width $W_2$ or diameter of the lower portion of a trench capacitor 160 is greater than the width $W_1$ or the diameter of the upper portion, Increasing $W_1$ increases the capacitance of the capacitor. To achieve such a structure, the sacrificial polysilicon layer 152 described in FIG. 4b is removed by CDE, using, for example, $NF_3/Cl_2$ chemistry. Other chemistries for selectively etching silicon are also useful. Additionally, an RIE using $SF_6$, $NF_3$/HBr or a wet etch using KOH chemistry are also useful. The bottom part of the trench is expanded by, for example, a CDE etch. Expansion of the trench is described in, for example, T. ozaki et al, 0.228 $\mu m^2$. Trench Cell Technologies with Bottle-shaped Capacitor for 1 Gigabit DRAMs, IEDM 95, pp. 661 or U.S. Pat. No. 5,336,912 to S. Ohtsuki, which is herein incorporated by reference for all purposes. The etchant for the CDE etch is selected to also remove the thin native oxide film on the trench sidewalls. This can be achieved by reducing the flow rate of $Cl_2$ to decrease the selectivity of the etch to oxide, or by changing the chemistry.

The wet etch or CDE is timed so as to remove the sacrificial polysilicon while limiting the expansion from extending into or contacting adjacent trenches. The expansion of the bottom portion of the trench is about 50% of the minimum spacing between adjacent trenches, preferably less than 20–30% of the minimum spacing between adjacent trenches. Since the spacing between adjacent trenches is typically equal to about minimum groundrule, the expansions should be limited to less than 50% of the minimum groundrule. This would provide, for example, a bottle-shaped trench whose lower diameter is less than two times the minimum groundrule. Preferably, the expansion of the trench is about 20–40% of the minimum ground rule.

After removing the sacrificial polysilicon and the etch stop layer, the buried plate 165 may optionally be formed. Various techniques for forming the buried plate, such as, for example, gas-phase doping with $AsH_3$ or $PH_3$ at temperatures of about 1000–1100° C., ion implantation of As or P, plasma doping or plasma-immersion ion implantation are also useful. The doped polysilicon is then deposited to form the node electrode. The doped polysilicon, as it fills the lower portion of the trench, forms a void 172 therein. Since the void 172 is located in the lower portion of the trench, it does not impact subsequent processing or device functionality. Other techniques to enhance trench capacitance such as forming hemispherical silicon grain (HSG) in the trench or roughening the trench sidewalls prior to node dielectric deposition are also useful FIGS. 6a–c show a third embodiment of the inventive method for forming the DRAM cell of FIG. 3.

Referring to FIG. 6a, the substrate 101 is provided. As shown, the substrate includes the buried n-type well 170. The pad stack 107, which includes the pad oxide layer 104, the pad stop layer 105 and the hard mask layer 106, is formed on the surface of the substrate 101. The pad stack 107 is patterned to define the trench region 102, and a deep trench 108 is formed therein by RIE.

After formation of the trench 108, an etch stop layer 176 is deposited on the trench sidewalls. The etch stop layer 176 is particularly useful if the native oxide layer 151 (see FIG. 4a) on the trench sidewalls is too thin (about <1 nm) to sufficiently serve as an etch stop. The etch stop layer 176 covers the pad stack 107 and lines the trench sidewalls. In another embodiment, the etch stop layer comprises a material which polysilicon can be removed selective thereto. The thickness of the etch stop player 176 is sufficient to enable a subsequently deposited sacrificial polysilicon material 152 to be removed from the trench 108 without expanding the sidewalls to avoid a deformation of the trench, for example undercuts under the pad oxide. The actual thickness that is required is optimized depending on the process condition of the etch used to remove the sacrificial polysilicon 152. Typically, the thickness of the layer is 1–20 nm, preferably about 1–5 nm.

In another embodiment, the etch stop layer comprises a dielectric material, such as oxide, nitride or oxynitride, formed by various techniques, such as a thermal growth or CVD. Preferably, the etch stop layer comprises oxide. The use of oxide advantageously prevents the need to remove the upper portion prior to the formation of the collar or removing the lower portion after removal of the sacrificial polysilicon.

The sacrificial polysilicon layer 152 is deposited over the wafer, filling the trench 108. The sacrificial polysilicon 152 is recessed, removing it from the upper portion of the trench, namely to about the bottom of the trench 168 to be formed. Optionally, the exposed portion of the etch stop layer in the upper portion of the trench is removed using, for example, a wet etch comprising DHF chemistry. A oxide layer 167 is then formed, covering the upper portion of the trench sidewalls and the top of the sacrificial polysilicon The dielectric layer, which serves as the collar oxide, typically includes a thin thermal oxide under a CVD oxide. Optionally, an anneal can be performed to densify the collar layer. Alternatively, the collar oxide is formed by depositing a CVD oxide and densifying it in an oxidizing ambient. This facilitates the formation of a thermal oxide at the interface trench/CVD oxide, improving the reliability of the collar 168. Formation of a purely thermally grown collar oxide (e.g. 30–40 nm) is also possible, but involves a stronger dislocation formation tendency.

Referring to FIG. 6b, the collar layer 168 is etched by RIE for form collar 168. The sacrificial polysilicon 152 is then removed with an RIE or CDE. A wet etch is also useful in removing the sacrificial material. The oxide etch stop layer prevents the etch from expanding the trench sidewalls during removal of the sacrificial polysilicon.

Referring to FIG. 6c, the oxide etch stop layer 176 is then removed. The buried plate 165 is then formed using previously discussed techniques. A dielectric layer 164 is deposited over the wafer, covering the collar 168 and trench sidewalls in the lower portion of the trench. The dielectric layer serves as the node dielectric of the trench capacitor. A doped polysilicon 161 is then deposited, filling the trench. The process for forming the trench capacitor and memory cell continues, as discussed with reference to FIGS. 4d–g.

FIGS. 7a–c show a fourth embodiment of the inventive method for forming the DRAM memory cell of FIG. 3.

As shown, the pad stack 107 comprising the pad oxide layer 104, the pad stop layer 105 and the hard mask layer (not shown) is formed on the surface of the substrate 101. The pad stack 107 is patterned to define a trench region 102. A RIE is performed to form the deep trench 108 in the trench region 102. An n-type buried well 170 is also provided in the substrate 101.

The hard mask layer 106 is stripped after the formation of the trench, leaving the pad stop layer 105 and the pad oxide layer 704 above the substrate surface. An etch stop layer 176 is formed to serve as an etch stop for the removal of the sacrificial polysilicon 152 from the trench. After formation of the etch stop layer, the sacrificial polysilicon 152 is deposited to fill the trench 108. The sacrificial polysilicon 152 is recessed to a desired depth, which is about the bottom of the collar 168. The exposed portion of the etch stop layer 176 may be removed by, for example, a wet DHF etch or CDE. The removal of the exposed portion of the etch stop layer 176 also removes the RIE damage and contamination of the trench, improving the reliability of the subsequently formed collar 168. A dielectric layer 167 is then deposited, covering the surface and the sidewalls of the trench. The dielectric layer is used to form the collar 168.

An anneal is performed to densify the dielectric layer 167. Alternatively, a CVD oxide is deposited and annealed in an oxidizing ambient to density the CVD oxide and to form a thermal oxide beneath the CVD oxide in a single thermal processing step.

Referring to FIG. 7b, a RIE is performed to form the collar 168. After the RIE, the sacrificial polysilicon 152 and the etch stop layer 176 are removed.

Referring to FIG. 7c, the buried plate 165 is formed using techniques already described. The node dielectric 164 is formed. N-doped polysilicon 161 then fills the trench.

Then the polysilicon 161 fill is recessed to define the buried strap 162 according to the process stage shown in FIG. 4g. The node dielectric 164 and the collar oxide 168 are removed, and the polysilicon or amorphous silicon for the buried strap 162 is deposited, planarized and recessed. At this point, the method continues as already discussed with reference to FIG. 4g.

In connection with this fourth embodiment, it should be mentioned that for a suitably thin etch stop layer 176, i.e. having a thickness through with the dopants such as As and P may diffuse, the buried plate 165 can be formed by outdiffusing the sacrificial polysilicon 152 which for this purpose has to be doped (e.g. with as or P).

FIGS. 8a–e show a fifth embodiment of the inventive method for forming the DRAM memory cell of FIG. 3.

In this fifth embodiment, instead of the undoped etch stop layer 176 according to the third and fourth embodiments or the native oxide 151 of the first and second embodiments, a doped etch stop layer 177 (e.g. ASG, PSG, . . . ) is used, which serves as dopant source for the formation of the buried plate 165.

Figure 8A:
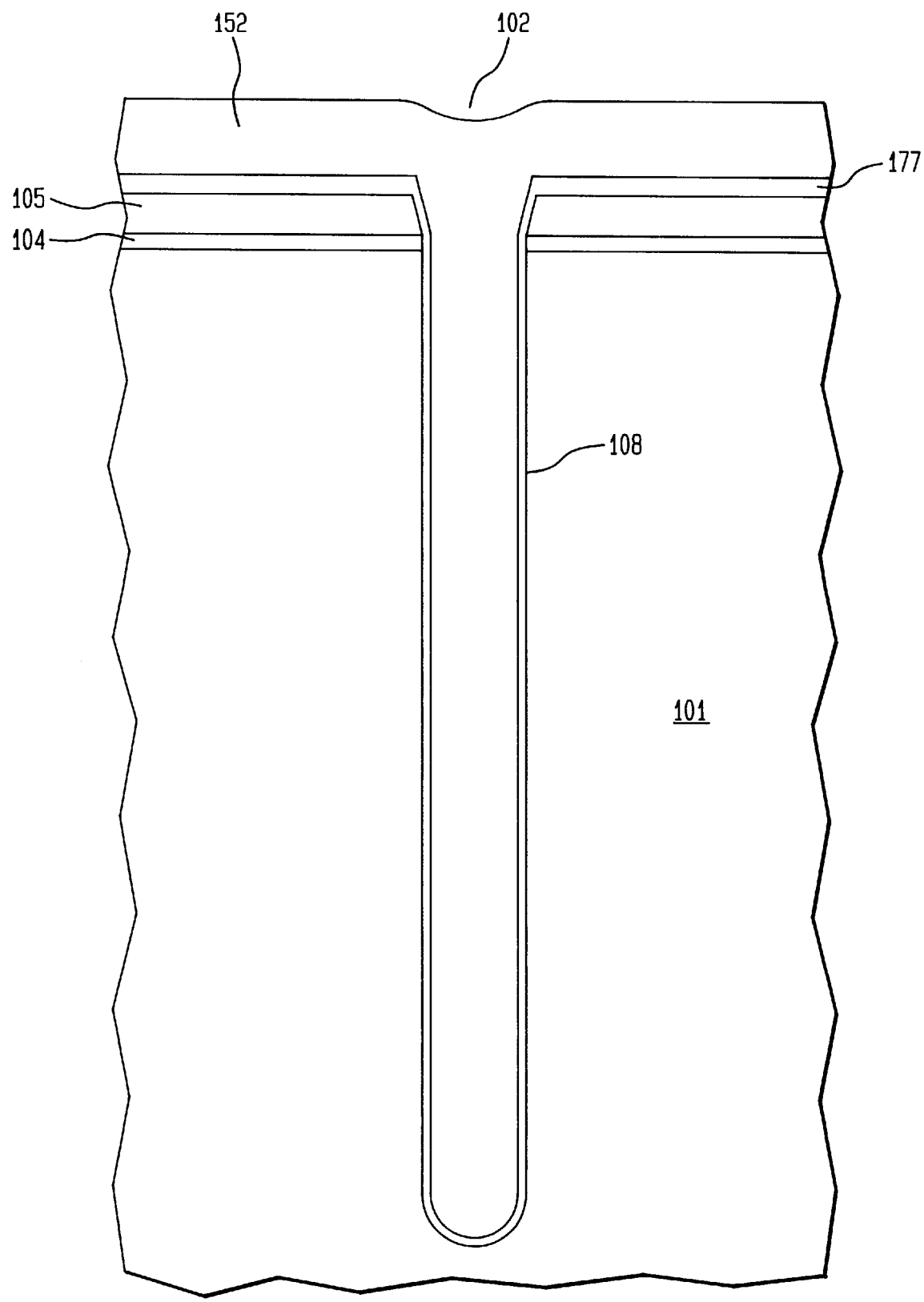

AS shown in FIG. 8a, the trench 108 is first formed, as already explained above. Then, after removing the hard mask layer 106 on the pad stop layer 105 and on the sidewalls of the trench 108, for example, an ASG layer as etch stop layer 177 with a thickness of typically 10 to 20 nm is deposited. Instead of ASG, also PSG or CVD oxide doped with As or P, for example, by PLAD or ion implantation may be used.

Optionally, a cap layer (not shown) having a thickness of 0.5–20 nm, such as PECVD-TEOS or silicon nitride, is formed on the surface of the ASG etch stop layer 177 to prevent that the dopant passes out of the ASG etch stop layer 177 into the sacrificial polysilicon 152 to be provided in the trench 108. Thereafter, the sacrificial polysiliqon 152 is deposited in the trench and on the surface of the wafer. The sacrificial polysilicon 152 does not have to be doped, because in this fifth embodiment it does not have the function of a dopant source, but should be undoped in order to allow a higher deposition rate.

In general, the thickness of the doped ASG etch stop layer 177 can be within the range 2–80 nm depending on the material and trench dimension and should have a planar surface and a stop coverage of, for example, 50%. By reducing the deposition pressure, even higher values for step coverage are achievable.

Figure 8B:
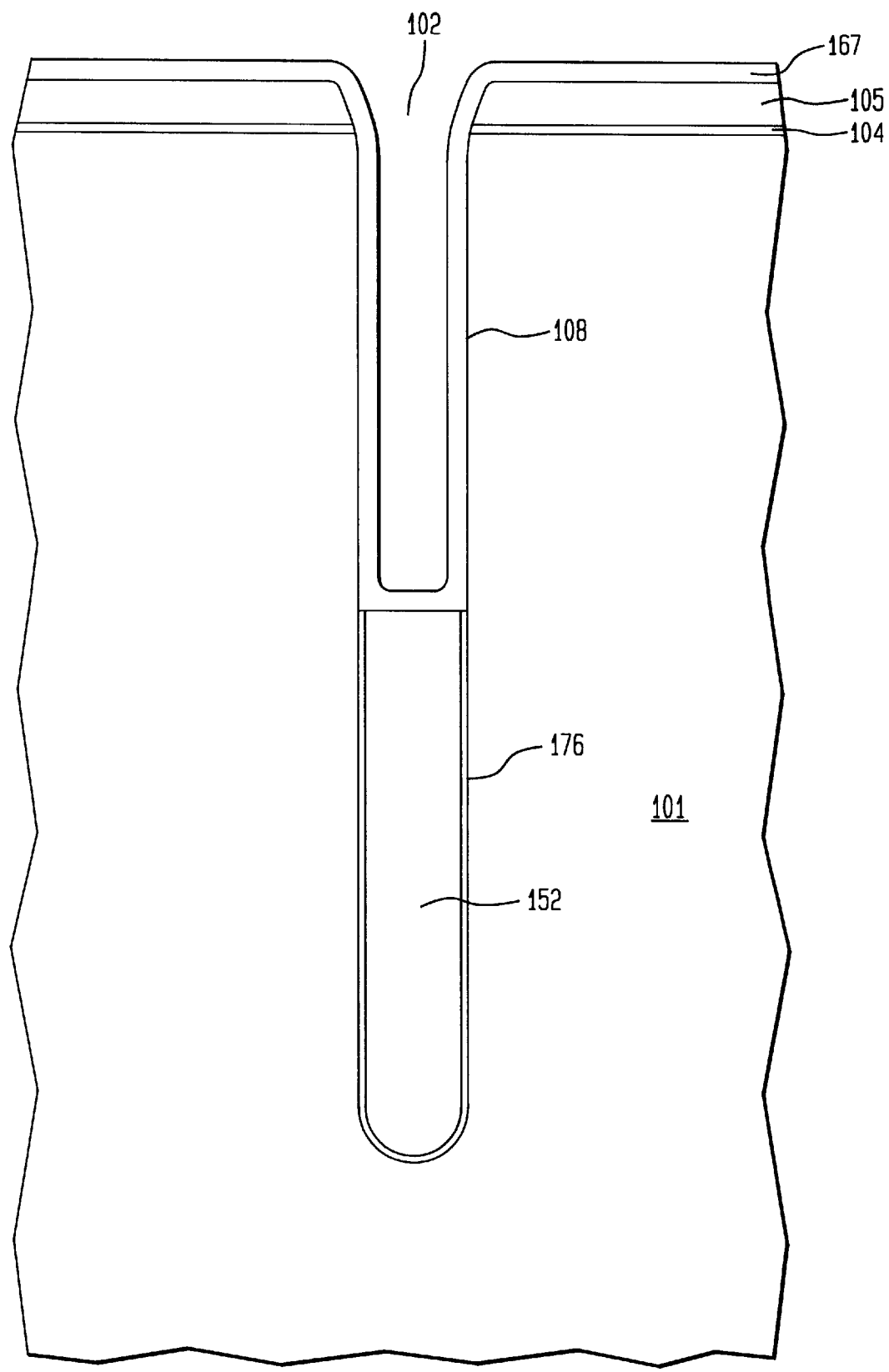

As shown in FIG. 8b, the sacrificial polysilicon 152 is recessed by about 0.5 to 2 µm from the surface of the substrate 101 to define the collar region. Subsequently, the ASG etch stop layer 177 is removed, for example, by a BHF wet etch or a CDE etch, If an optional nitride cap layer was used, it must be removed before the removal of the ASG layer, for example by CDE (chemical dry etching) or wet etch (e.g. HF/ethyleneglycol).

Thereafter, the collar oxide layer 167 is deposited by CVD Ioxide formation having a thickness of 10–60 nm at the trench sidewalls and the substrate surface or by thermal oxidation of 5–10 nm and subsequent CVD oxide formation of 10–60 nm thickness.

Figure 8C:
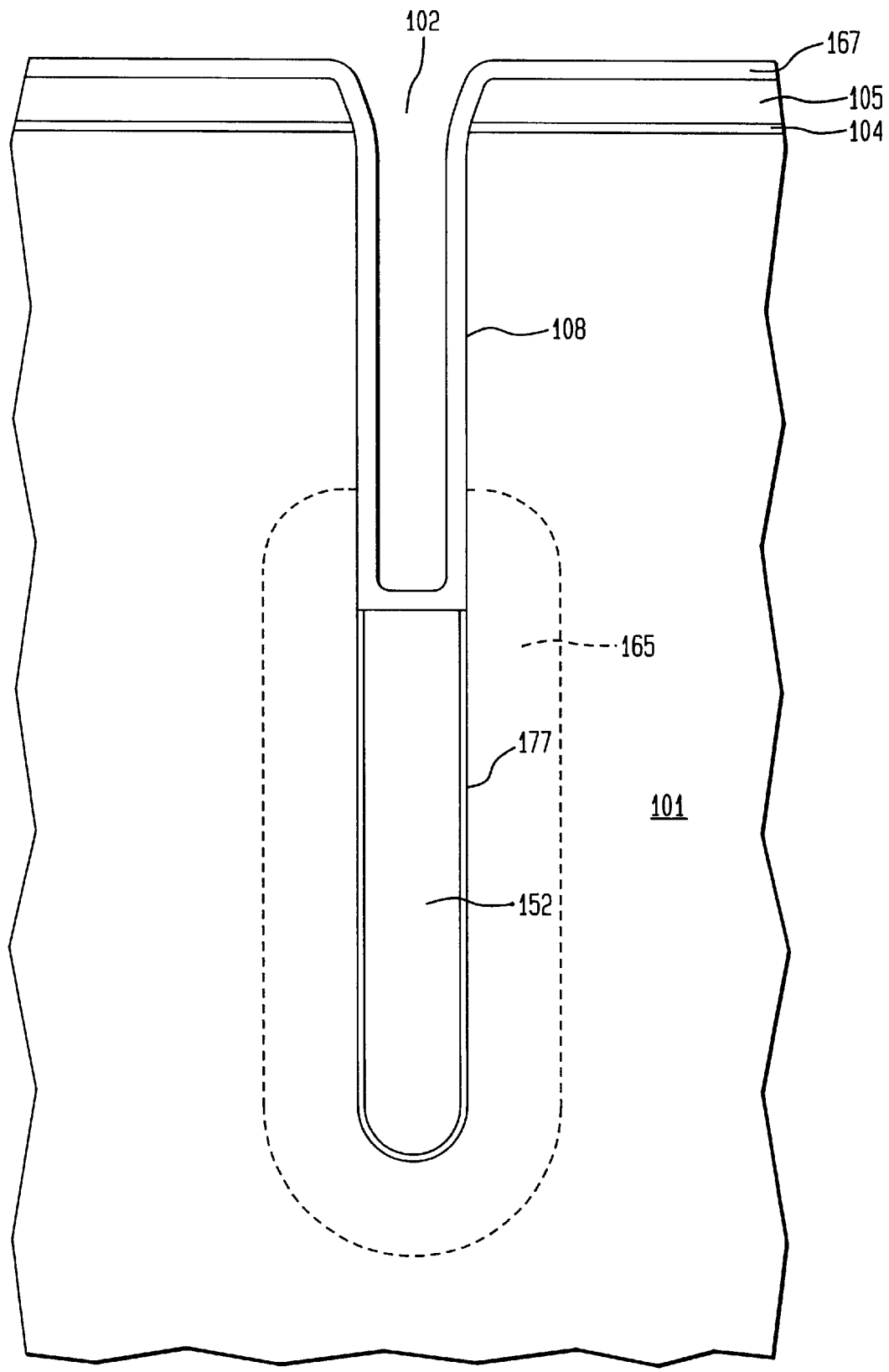

As shown in FIG. 8c, thereafter in a single process step, the collar oxide layer 167 is densified and the buried plate 165 is outdiffused from the ASG etch stop layer 177, for example, at 1000° C. during one hour. If the collar oxide layer 167 was only formed by CVD deposition, advantageously first a thermal oxidation is performed, for example, at 900° C. and during five minutes (oxygen diffuses through the CVD oxide), to form a thermal oxide at the interface silicon substrate/collar, improving the reliability of the collar 168 to be formed. The thermal oxidation can, of course, be performed in the same high temperature process step as the collar densification and the diffusion of the buried plate 165.

Figure 8D:
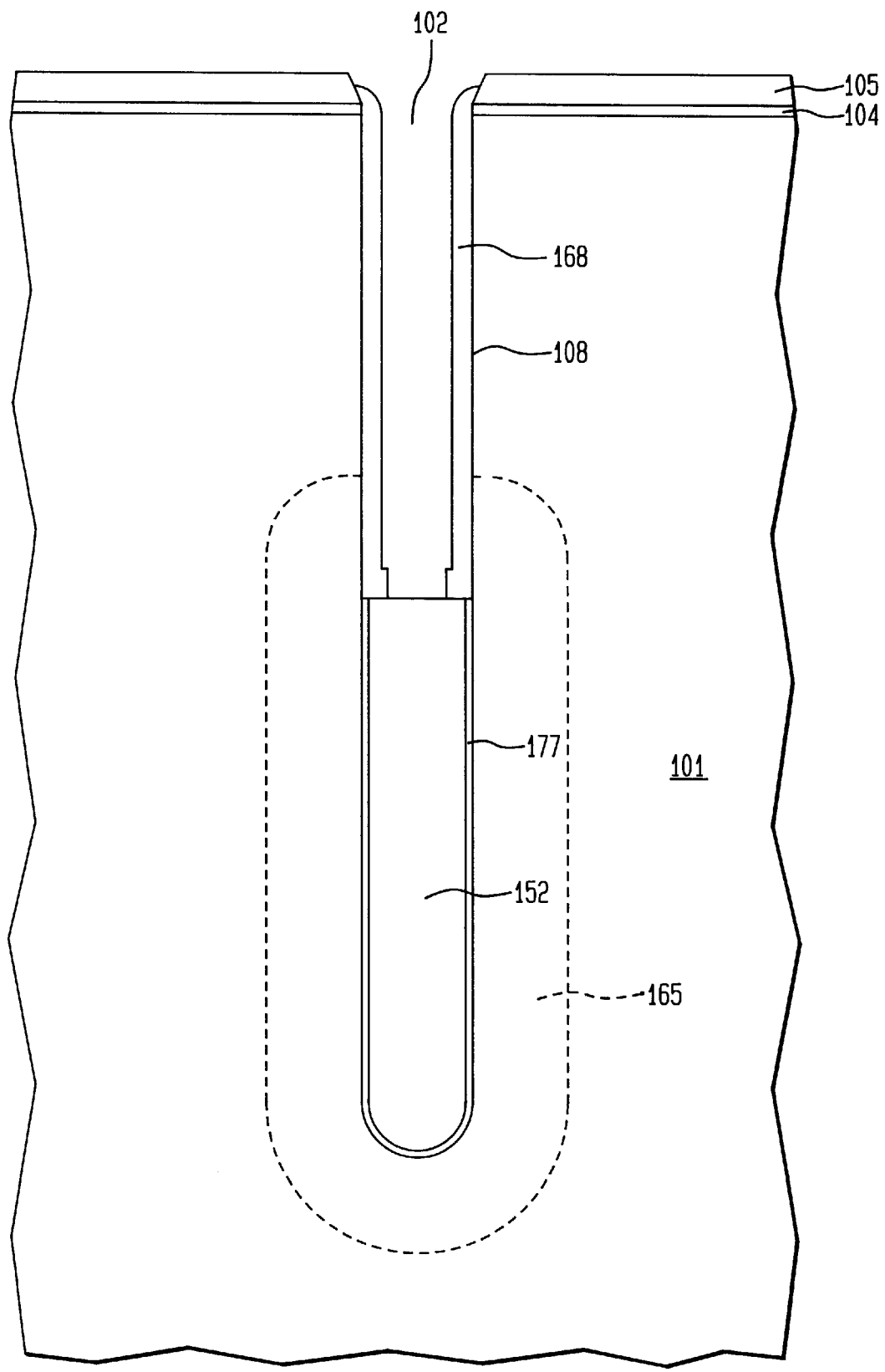

Subsequently, as shown in FIG. 8d, a reactive ion etching for forming the collar 168 is performed.

Figure 8E:
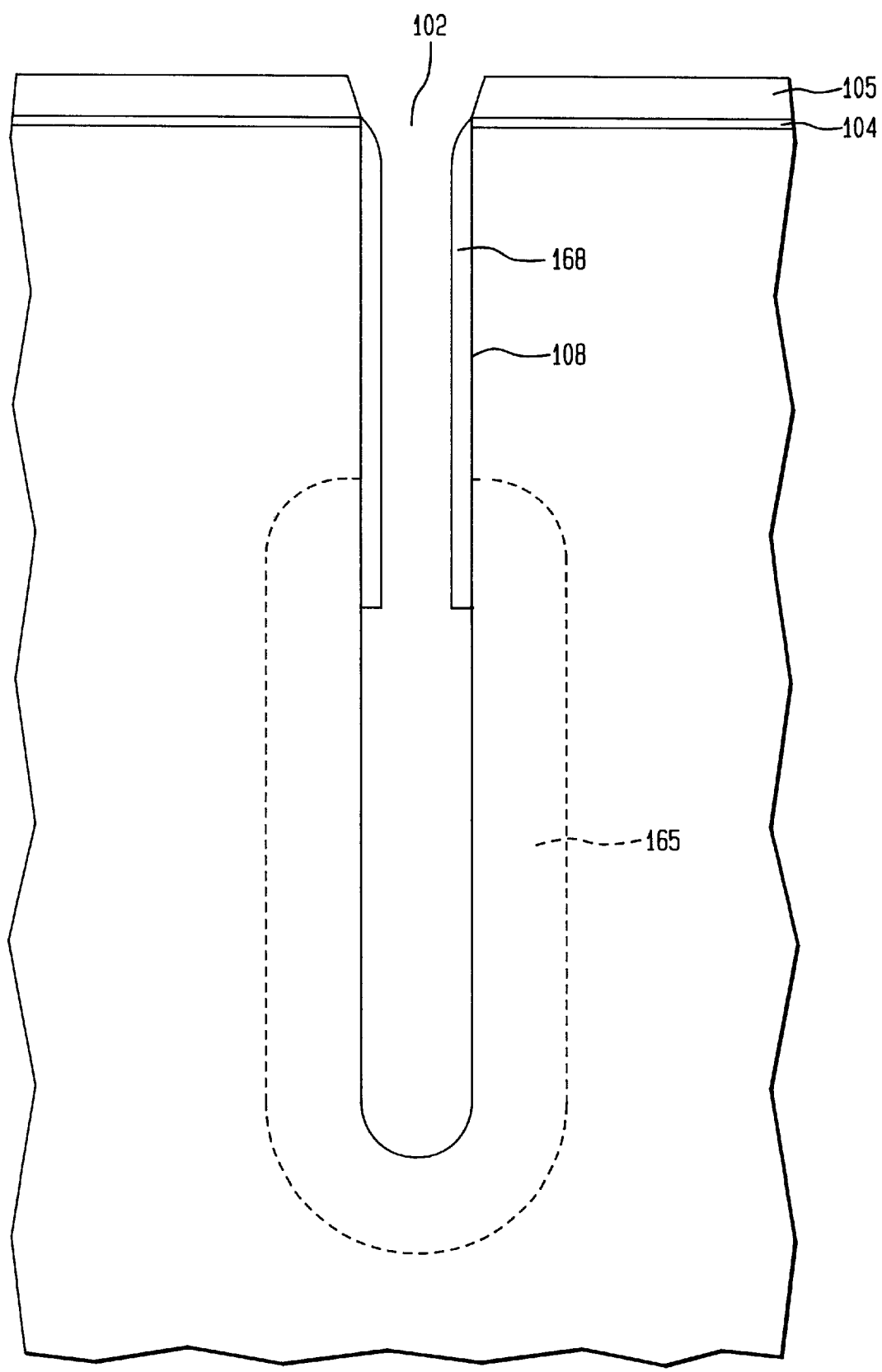

Finally, as shown in FIG. 8e, the sacrificial polysilicon 152 is removed by PIE, CDE or wet etch, and the ASG etch stop layer 177 is removed by a BHF wet etch or a CDE etch.

Thereafter, the node dielectric 164 and the fill polysilicon 161 are deposited so as to reach the state shown in FIG. 7c. Then for reaching the process stage shown in FIG. 4g, the fill polysilicon 161 is recessed to define the buried strap 162. The node dielectric 164 and the collar oxide 168 are removed and the polysilicon or amorphous silicon for the buried strap 162 are deposited, planarized and recessed. A this point, the method continues as already described with reference to FIG. 4g.

It should be mentioned that the process sequence according to the fifth embodiment can of course be used for a bottle-shaped trench which has an enhanced trench capacity (see FIG. 5).

As well, the process can be performed with doped etch stop layer and undoped sacrificial polysilicon, similarly as described with reference to FIG. 6. The hard mask layer is not removed just after the etch of the trench 102 as in FIG. 7a, but after the recess of the sacrificial polysilicon 161 as described in FIG. 4e and after a recess of the exposed node dielectric 164. This procedure is of advantage if the polysilicon etches (particularly the strip of the sacrificial polysilicon 161) cause a strong removal of the pad nitride, However, this procedure requires additional etch steps, increasing the manufacturing costs by some amount, Also in all further embodiments, the hard mask layer 106 may be already removed after the etch of the deep trench or, as described in connection with FIG. 4, after the first recess step (FIG. 4e) of the sacrificial polysilicon 161 and removal of the node dielectric 164 exposed by an etch.

The advantages of the fifth embodiment are a simplified process for the simultaneous formation of the collar 168 and the buried plate 165. The buried plate 165 is self-adjusted to the bottom of the collar 168, in contrast to the processes used so far wherein the buried plate 165 is formed before the formation of the oxide collar by a photoresist recess process (Nesbit et al., see above). Thereafter, in the modification described by Nesbit et al., the collar is formed by a polysilicon recess, making the case possible that the buried plate and the oxide collar are misaligned to each other (e.g. the buried plate is too deep or too high and short-circuits the selection transistor). In the present invention, this problem is solved by self-adjusting processes.

Since the etch stop layer 177 is the dopant source for the buried plate 166, there are no restrictions concerning thickness, considerably reducing the stringent selectivity requirement (polysilicon to oxide) for the polysilicon recess process and the sacrificial polysilicon removal process. These etch processes are therefore much easier controllable.

FIGS. 9a–f show a sixth embodiment of the inventive method for forming the DRAM memory cell of FIG. 3.

Also in this sixth embodiment, the node dielectric is formed after formation of the collar and the buried plate and continuously extends from the trench bottom to the upper edge of the collar, avoiding the formation of pinholes at the lower collar edge.

Particularly, the sixth embodiment uses multiple layers of etch stop layers and sacrificial polysilicon layers. Most preferred is the sequence of a first etch stop layer 181, a first sacrificial polysilicon layer 182, a second etch stop layer 183 and a second sacrificial polysilicon layer 184.

This alleviates the stringent requirements concerning the selectivity of the polysilicon etch with respect to the etch stop layer and the step of recessing the sacrificial polysilicon or in the step of removing the sacrificial polysilicon even more. Possibly, there is a slight increase of the manufacturing costs, but the method is even more reliable and allows the use of etch processes and apparatus which allow only low etch selectivities.

Figure 9A:
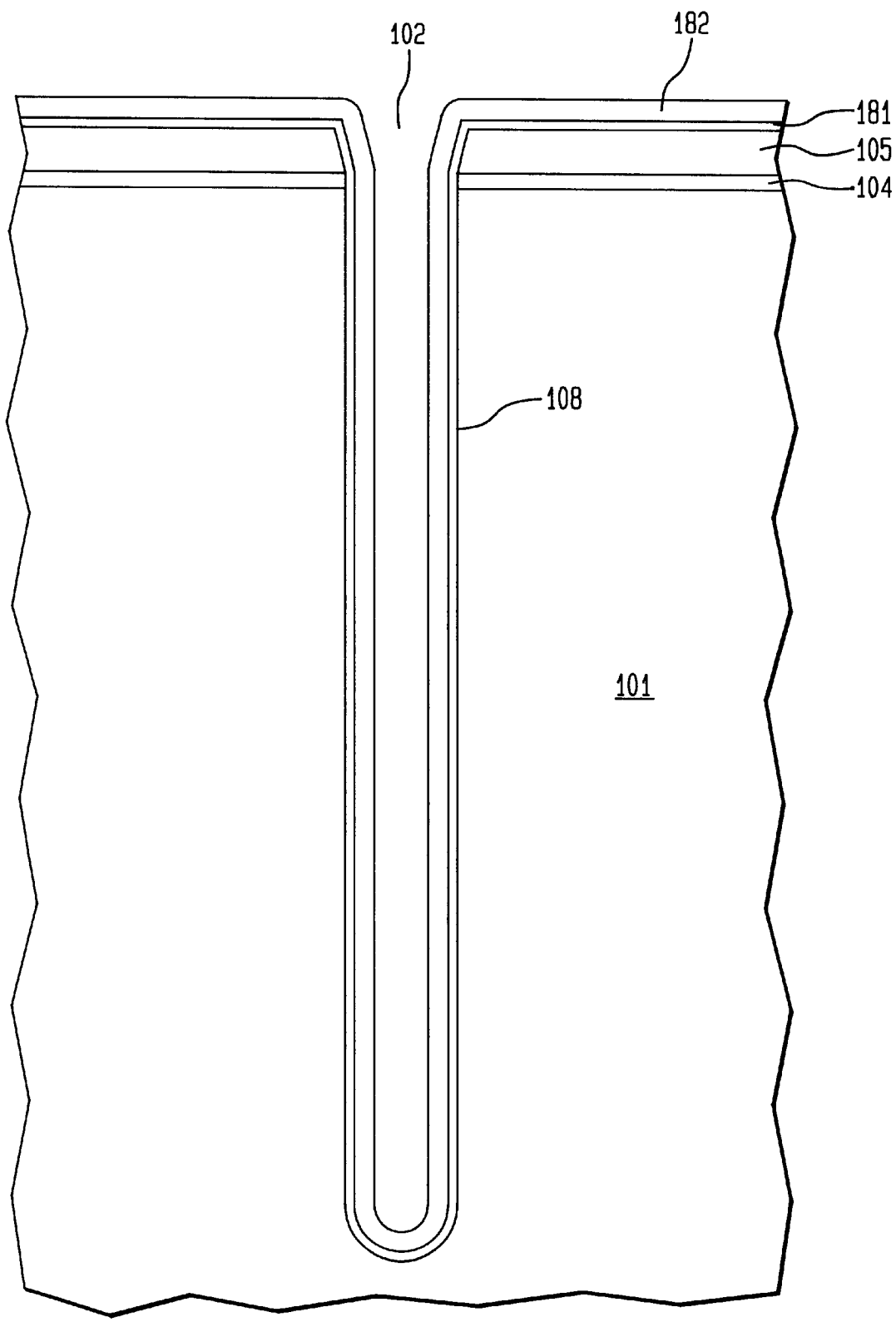

As shown in FIG. 9a, first the trench 108 is formed in the described manner, and thereafter the corresponding hard mask layer 106 is removed, leaving only the pad oxide layer 104 in the pad stop layer 105 of the pad stack 107.

Thereafter, the first etch stop layer 181 is formed. It can be formed, for example, of undoped native oxide (0.3–1 nm), undoped thermal oxide (0.5–1 nm), undoped oxide from a wet chemical process (0.6 nm) or undoped CVD oxide (0.5–1 nm).

The first etch stop layer 181 can also be doped and be used as dopant source for the buried plate 165 (as described in connection with the fifth embodiment).

Thereafter, a first sacrificial polysilicon layer 182 is deposited on the first etch stop layer 181, namely either doped or undoped, doped being preferred. If the first sacrificial polysilicon layer 162 is doped, suitably As or P is used as dopant source for the buried plate 165, the layer being deposited with a thickness of 10–40 nm. The doping may be performed in situ. Also an ion implantation or a plasma doping (PLAD) are possible after the deposition of undoped polysilicon.

Figure 9B:
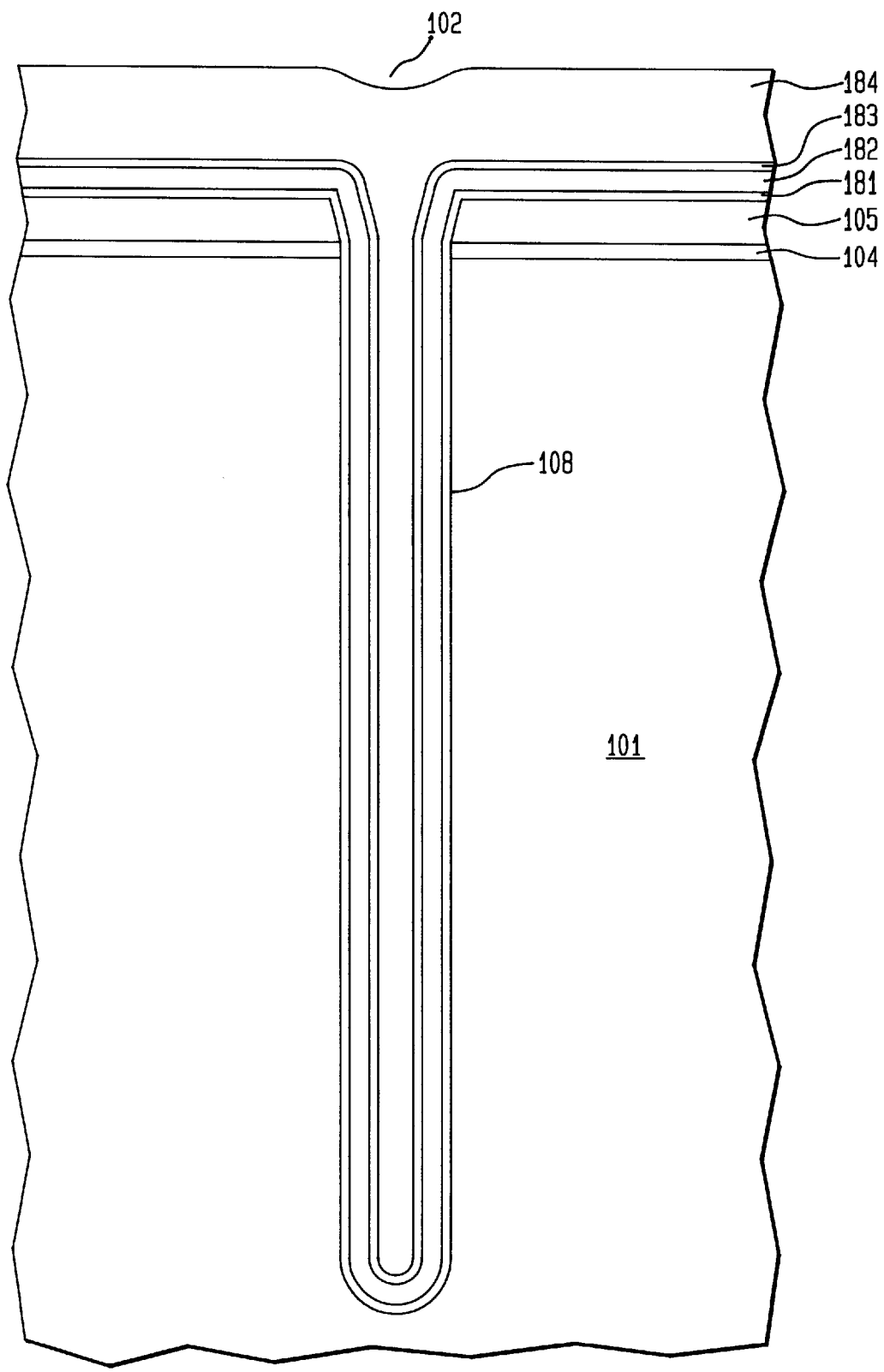

As shown in FIG. 9b, a second etch stop layer 183 is then deposited on the first sacrificial polysilicon layer 182, namely undoped, if the first sacrificial polysilicon layer 182 or the first etch stop layer were doped, and doped (e.g. ASG, PSG, . . . ), if the first sacrificial polysilicon layer 182 was undoped, having a thickness of typically 5–50 nm with a planar surface and with a step coverage of, for example, 40–50%.

If an undoped second etch stop layer 183 is used, it can be of the following material: thermal oxide (5 nm), oxide of a wet chemical process (0.6–1 nm) or CVD oxide (1–10 nm).

A second sacrificial polysilicon layer 183 is then deposited on the second etch stop layer 183, namely doped or undoped, undoped being preferred, and having a thickness of typically 200–300 nm for filling the trench 108. If an undoped layer is used, a higher deposition rate may be achieved. A doping is not necessary, because the inner layer(s) only contribute little or even nothing to the outdiffusion into the buried plate 165 in the corresponding anneal step.

Figure 9C:
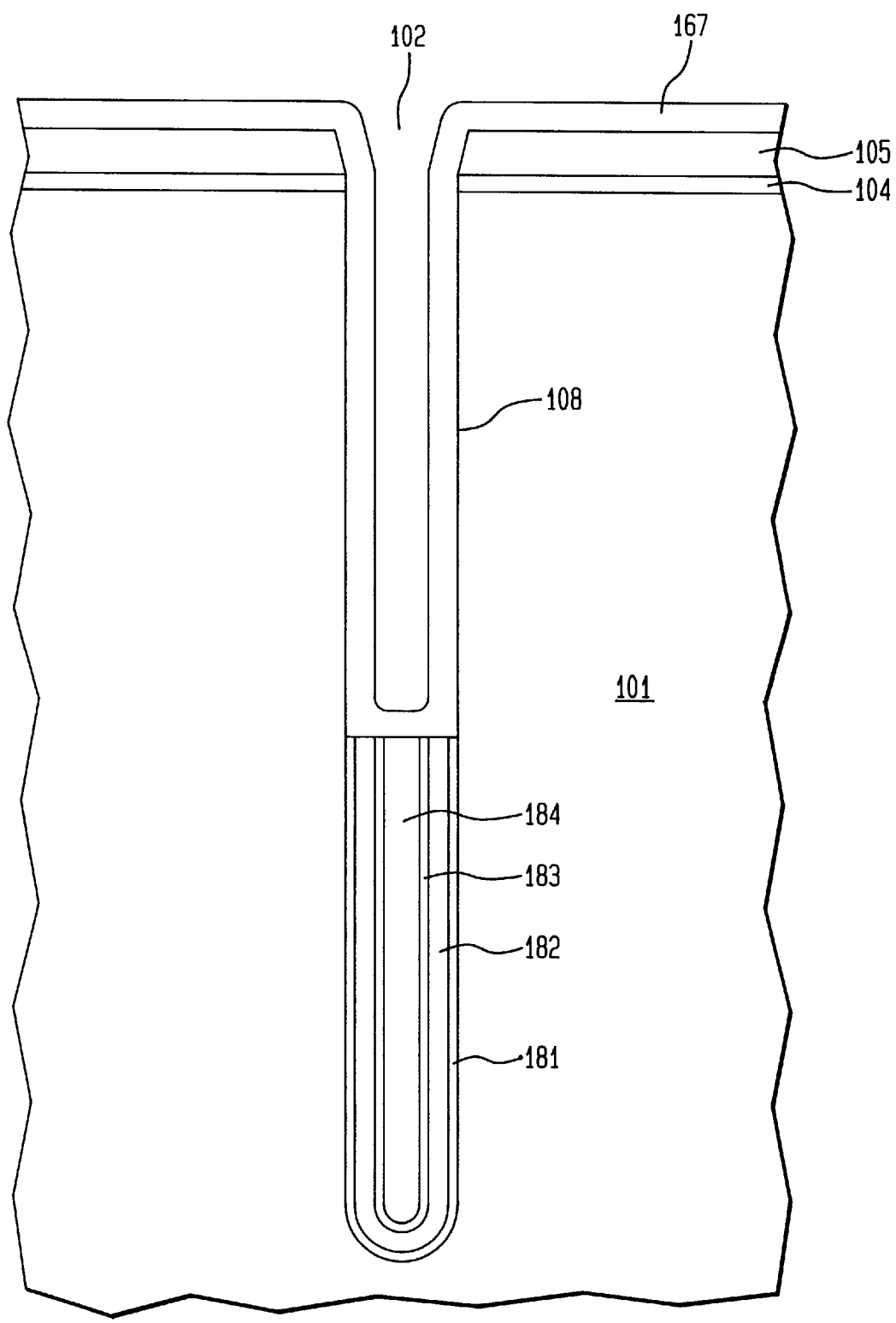

As shown in FIG. 9c, subsequently the second sacrificial polysilicon 184 for defining the collar region is typically recessed by 0.5–2 μm from the substrate surface, for example by reactive ion etching (SF$_6$ or NF$_3$/HBr) or by CDE (NF$_3$/Cl$_3$) or by a suitable wet etch. Thereafter, the second etch stop layer 183 is removed by a BHF wet etch or by a CDE etch. Then the first sacrificial polysilicon 182 is recessed.

If the first etch stop layer 182 is thicker than native oxide (0.3–0.5 nm), it is removed by wet etch or by CDE etch in an individual process step. If not, this can be performed during the pre-clean for the trench fill.

Thereafter, the collar oxide layer 167 is deposited as already explained above in detail.

Figure 9D:
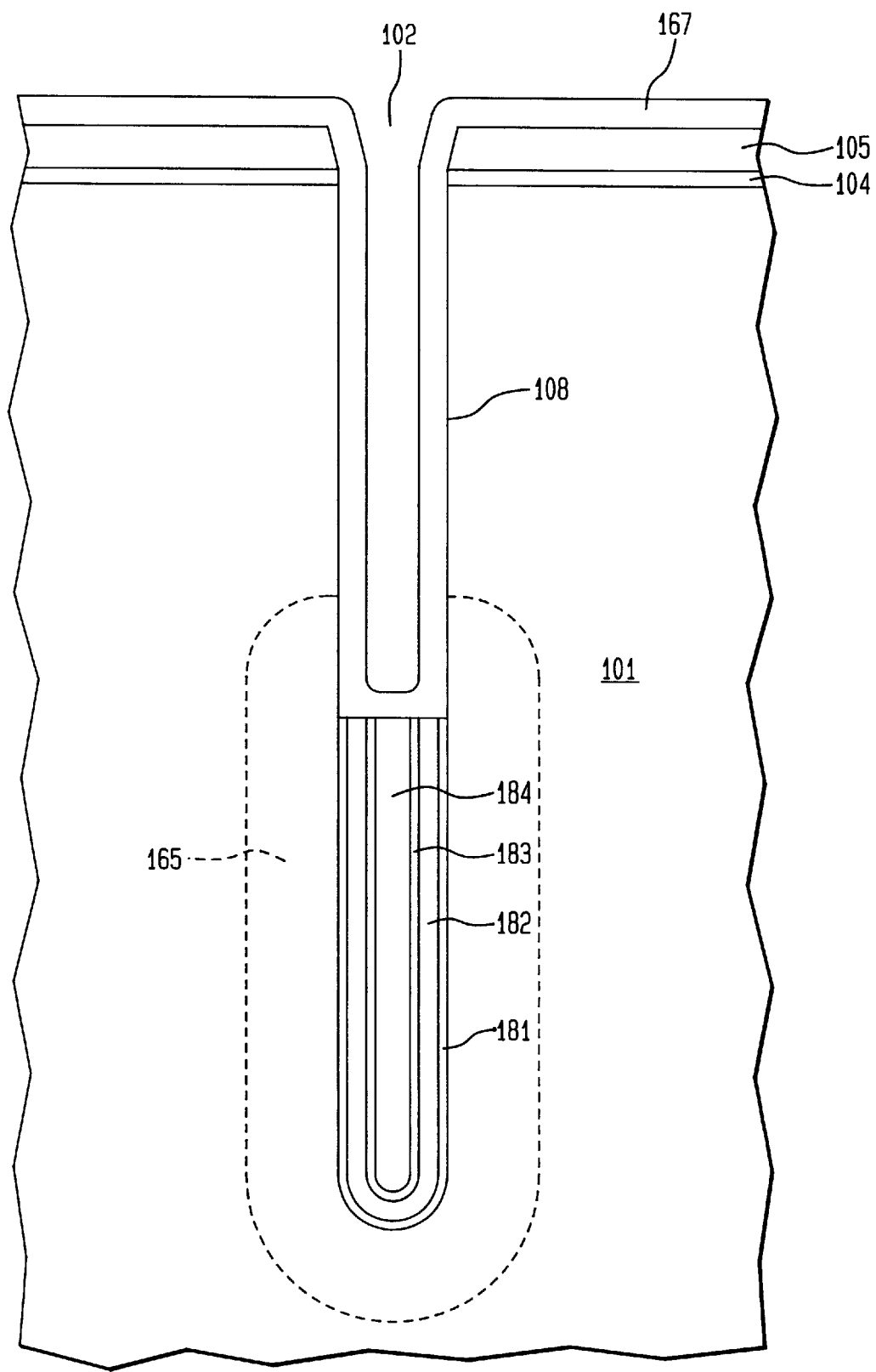
Figure 9E:
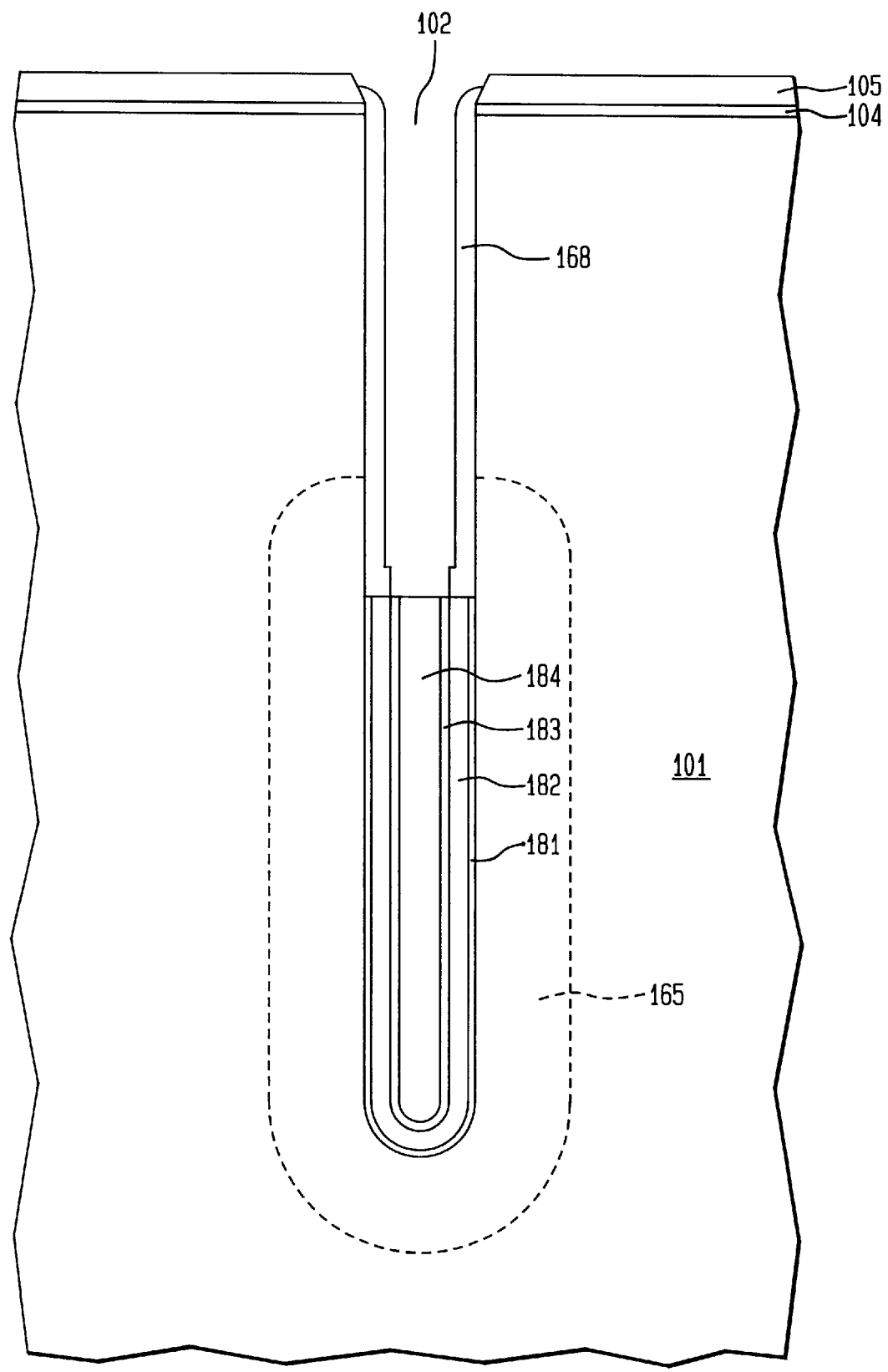

As shown in FIG. 9d, the collar oxide layer 168 is densified an the buried plate 165 is driven in, namely in a common high temperature step, as explained in connection with the fifth embodiment. Thereafter, the collar 168 is opened by RIB, as shown in FIG. 9e.

Figure 9F:
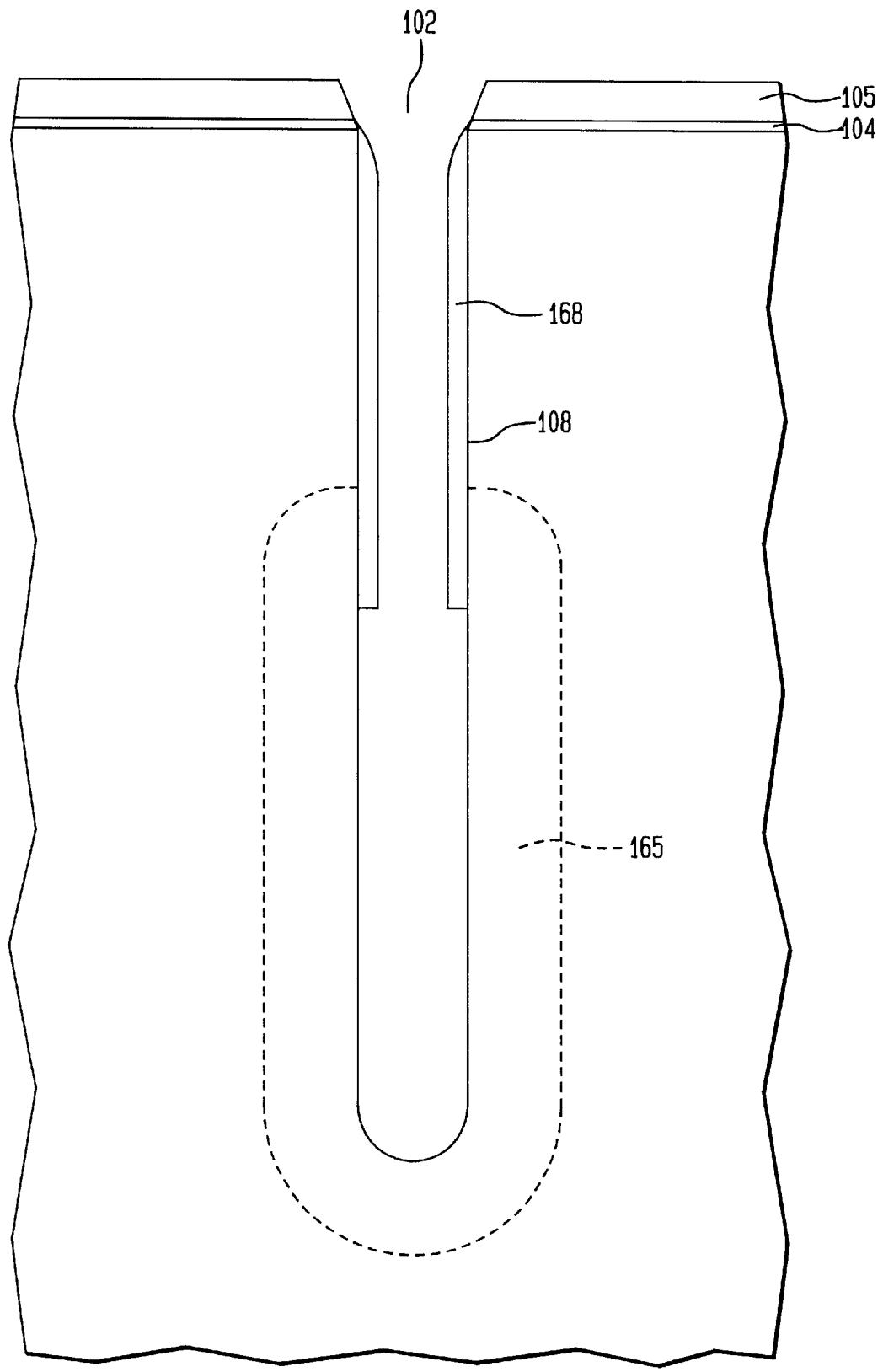

Finally, the second sacrificial polysilicon layer 184, the second etch stop layer 183, the first sacrificial polysilicon layer 182 and the first etch stop layer 181 are removed from the lower region of the trench 108, leading to the process stage shown in FIG. 9f.

Thereafter, the node dielectric 164 and the fill polysilicon 161 are deposited to reach the state depicted in FIG. 7c. Then, to get to the process state shown in FIG. 4g, the fill polysilicon 161 is recessed to define the buried strap 162. The node dielectric 164 and the collar oxide 168 are removed, and the polysilicon or the amorphous silicon for the buried strap 162 is deposited, planarized and recessed. At this point, the method continues as already described with reference to FIG. 4g.

At this point it should be mentioned that for the sixth embodiment also the bottle-shaped trench form according to FIG. 5 is applicable.

The particular advantages of the sixth embodiment are that there is no limitation regarding the thickness of the second etch stop layer, because the dopants (As, P) do not have to diffuse through the second etch stop layer. The second etch stop layer is an etch stop during removal of the second sacrificial polysilicon layer, alleviating the stringent selectivity requirements (polysilicon to oxide) for the recess of the polysilicon and for the removal of the sacrificial polysilicon. The corresponding etch processes are therefore much easier to be controlled, FIG. 10 shows another embodiment of a DRAM cell according to the present invention related to a seventh embodiment of the inventive method As shown in FIG. 3, in this embodiment of the inventive DRAY cell, there are two internal interfaces 200, 201 for the trench capacitor 160, namely a first interface between the polysilicon fill 161 and the buried strap 162, and a second interface between the buried strap 162 and the node junction diffusion region 125 in the substrate 101.

These two interfaces 200, 201 have an increased electrical resistance and slow down the velocity in the write/read cycles of the memory means using the DRAYI cell. The interface 200 is typically a polysilicon/polysilicon interface, and the interface 201 is typically a silicon single crystal/polysilicon interface.

The embodiment shown in FIG. 10 of a DRAM cell has only one interface 201 between the polysilicon fill 161 and the node junction diffusion region 125 in the substrate 101. The buried strap 162 is not provided in this embodiment.

Thus, this embodiment has a lower transition resistance between the transistor 110 and the trench capacitor 160, reducing its sensitivity to failures when transferring charge from and to the trench capacitor 160 in read/write cycles and enables a higher velocity of the read/write cycles, respectively.

The remaining interface 201 may be a native oxide (e.g. 0.3–0.8 nm) of a previous wet pre-clean or it can be any suitable grown or deposited layer, such as thermal oxide or CVD oxide, oxynitride or nitride, having thicknesses in the range of typically 0.3–2 nm. An in situ pre-clean using H$_2$, HF steam or a UHV anneal may also be performed before forming the interface 201.

The particular importance of the design of the interface 201 is to avoid an uncontrolled recrystallization and defect formation at the interface of the buried contact between the transistor 110 and the trench capacitor 160. An important advantage of this embodiment is that there is only a single interface 201 for the buried contact, because the trench fill is performed after the definition of the buried contact region. Thus, the resistance for the read/write cycles is much reduced, and the process yield is correspondingly better.

FIGS. 11a–d show the seventh embodiment of the inventive method for forming the DRAM memory cell of FIG. 10.

As shown in FIG. 11a, which follows the process state according to FIG. 7c, the hard mask layer 106 is removed, the node dielectric 164 in the trench 108 and on the substrate surface is deposited and the trench 108 is filled with a sacrificial material 210, in this case a photoresist.

As shown in FIG. 11b, the sacrificial photoresist 210 is first recessed by a CDE etch, and then the upper region of the collar 168 together with the node dielectric layer 164 provided thereon is recessed to define the buried contact at the interface 201 to the substrate 101. Also this is performed by means of a CDE etch which is selective against the sacrificial photoresist 210 and the substrate 101 or by means of a corresponding wet etch.

An alternative of the sacrificial photoresist is a highly doped polysilicon layer (n-doped) or an amorphous silicon layer, which may be etched selectively to oxide, nitride and to the still undoped interface 201. The advantage in this case is the better controllability of the recess.

Optionally, the node dielectric 164 may be removed after the recess of the collar 168 from the sidewalls of the protruding sacrificial photoresist stud 210.

As shown in FIG. 11c, thereafter the sacrificial photoresist stud 210 is removed, namely e.g. by a CDE etch or a wet etch.

Thereafter, with reference to FIG. 11d, a pre-clean by means of a $H_2$ anneal or a HF steam step or a UHV anneal step is performed. A conventional wet chemical pre-clean (e,g. BHF etc.) is also possible.

Optionally, a barrier film is formed on the interface 201, for example, a thin oxide or nitride or oxynitride, namely with or without the pre-clean of the previous step, i.e. in situ, i.e. the wafer is not exposed to the cleanroom atmosphere.

The deposition of polysilicon 161 for filling the trench 108 and for connecting it to the interface 201 in the upper region of the collar 108 follows. The fill polysilicon 161 is, as already mentioned, usually doped with As, P having a concentration of $10^{19}$ cm$^{-3}$–$10^{21}$ cm$^{-3}$. In the end, the fill polysilicon 161 is planarized and, for example, about 50 nm under the substrate surface recessed to get to the process stage shown in FIG. 11d. The further process steps are such as described in connection with the embodiment shown in FIG. 4g.

FIG. 12 shows another embodiment of a DRAM cell according to the present invention related to an eighth embodiment of the inventive method. In analogy to FIG. 5, this seventh embodiment of the inventive method may be used for a bottle-shaped trench 108, which is illustrated in FIG. 12.

The particular advantages of the seventh and eighth embodiments of the inventive method are that a trench cell with a buried contact is provided which has only one interface, for example, polysilicon/single crystal silicon, whereas usually at least two interfaces are provided.

The particular steps of these two embodiments are the formation of the collar before the formation of the node dielectric and the definition of the buried contact using the photoresist recess process, wherein of course any other suitable material may be used instead of the resist, which is selectively removable to the collar (oxide), dielectric (nitride) and substrate (silicon), for example AS- or P-doped polysilicon, which may be etched by CDE selectively to oxide, nitride and undoped or p-doped silicon.

Although the present invention has been described above in the form of preferred embodiments, it is not restricted to these embodiments, but may be modified in various manners.

Particularly, the cited materials serve only as an example, and they may be replaced by other materials having suitable properties. The same is true for the listed etch and deposition processes.

Also the shown embodiments may be combined with each other regarding the sequence of the process steps.

LIST OF REFERENCE SIGNS.

| | |
|---|---|
| 100 | trench capacitor DRAM memory cell |
| 160 | trench capacitor |
| 101 | substrate |
| 161 | sacrificial polysilicon fill |
| 164 | node dielectric |
| 165 | buried plate |
| 110 | transistor |
| 112 | gate |
| 113, 114 | diffusion regions |
| 117 | channel |
| 125 | node junction diffusion region |
| 162 | buried strap |
| 168 | collar |
| 183 | contact |
| 185 | bitline |
| 189 | dielectric intermediate layer |
| 120, 120' | wordline |
| 107 | pad stack |
| 104 | pad oxide layer |
| 105 | pad stop layer |
| 106 | hard mask layer |
| 167 | collar oxide layer |
| 102 | trench region |
| 106, 108a, 108b | trench |
| 170 | buried well |
| 152 | polysilicon layer |
| 151 | native oxide |
| 172 | cavity |
| 176 | undoped etch stop layer |
| 177 | doped etch stop layer |
| 200 | interface polysilicon fill/ buried strap |
| 201 | interface buried strap/substrate |
| 202 | interface 1st polysilicon fill/ 2nd polysilicon fill |
| 210 | sacrificial photoresist or other suitable sacrificial material |
| 250, 250' | implantation region |

What is claimed is:

1. A trench capacitor comprising:
   a trench formed in a substrate, the trench comprising an upper and a lower region, wherein a diameter in the lower region is at least equal to about a diameter in the upper region;
   an isolation collar comprising oxide in an upper region of the trench;
   a dielectric layer lining the collar in the upper region of the trench and a lower region of the trench, the dielectric layer serving as a node dielectric of the trench capacitor; and
   a conductive material filling the trench, the conductive material serving as a plate of the capacitor; and
   a transistor coupled to the capacitor via a strap located above the isolation collar, the strap contacts the first plate of the capacitor, wherein the transistor and capacitor forms a memory cell.

2. The trench capacitor of claim 1 wherein the oxide isolation collar comprises CVD oxide and thermal oxide.

3. The trench capacitor of claim 1 wherein the strap comprises a buried strap.

4. The trench capacitor of claim 3 wherein the oxide isolation collar comprises CVD oxide and thermal oxide.

5. A trench capacitor comprising:

a trench formed in a substrate, the trench comprising an upper and a lower region, wherein a diameter in the lower region is at least equal to about a diameter in the upper region;

an isolation collar in an upper region of the trench, wherein the isolation collar comprises oxide;

a dielectric layer lining the collar in the upper region of the trench and a lower region of the trench, the dielectric layer serving as a node dielectric of the trench capacitor; and a conductive material filling the trench, the conductive material serving as a plate of the capacitor.

6. The trench capacitor of claim 5 wherein the oxide isolation collar comprises CVD) oxide and thermal oxide.

* * * * *